US012675039B2

(12) United States Patent
Ahn et al.

(10) Patent No.: US 12,675,039 B2
(45) Date of Patent: Jul. 7, 2026

(54) MASK FOR EXTREME ULTRAVIOLET LITHOGRAPHY AND METHOD FOR MANUFACTURING SAME

(71) Applicant: IUCF-HYU (INDUSTRY-UNIVERSITY COOPERATION FOUNDATION HANYANG UNIVERSITY), Seoul (KR)

(72) Inventors: Jinho Ahn, Seoul (KR); Jung Sik Kim, Seoul (KR); Dong Min Jeong, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 648 days.

(21) Appl. No.: 17/463,854

(22) Filed: Sep. 1, 2021

(65) Prior Publication Data

US 2021/0397078 A1     Dec. 23, 2021

Related U.S. Application Data

(63) Continuation of application No. PCT/KR2020/002774, filed on Feb. 26, 2020.

(30) Foreign Application Priority Data

Mar. 18, 2019     (KR) ........................ 10-2019-0030402

(51) Int. Cl.
*G03F 1/24*          (2012.01)
*G03F 1/54*          (2012.01)
(Continued)

(52) U.S. Cl.
CPC .................. *G03F 1/24* (2013.01); *G03F 1/54* (2013.01); *G03F 7/70033* (2013.01); *H10P 76/40* (2026.01)

(58) Field of Classification Search
CPC .......... G03F 1/24; G03F 1/54; G03F 7/70033; H01L 21/033
See application file for complete search history.

(56) References Cited

U.S. PATENT DOCUMENTS

| | | | |
|---|---|---|---|
| 2003/0039894 A1* | 2/2003 | Yan ........................... | G03F 1/24 430/323 |
| 2012/0219890 A1* | 8/2012 | Mikami ................... | G03F 1/24 430/5 |

(Continued)

FOREIGN PATENT DOCUMENTS

| | | |
|---|---|---|
| KR | 10-2009-0111683 A | 10/2009 |
| KR | 10-2011-0077950 A | 7/2011 |

(Continued)

OTHER PUBLICATIONS

English machine translation of KR-20170021191-A (Feb. 2017) (Year: 2017).*

(Continued)

*Primary Examiner* — Jonathan Johnson
*Assistant Examiner* — Jayson D Cosgrove
(74) *Attorney, Agent, or Firm* — Sughrue Mion, PLLC

(57)          ABSTRACT

A mask for extreme ultraviolet lithography is provided. The mask for extreme ultraviolet lithography comprises: a reflective structure comprising a plurality of unit layers laminated on a substrate and an etch stop layer placed between one pair (Continued)

of adjoining unit layers among the plurality of unit layers and having a trench through which the etch stop layer is exposed; and an absorption pattern placed on the bottom surface of the trench, wherein each of the unit layers comprises a first material layer and a second material layer on the first material layer.

4 Claims, 24 Drawing Sheets

(51) Int. Cl.
G03F 7/00 (2006.01)
H10P 76/40 (2026.01)

(56) References Cited

U.S. PATENT DOCUMENTS

| | | | |
|---|---|---|---|
| 2014/0234756 A1* | 8/2014 | Kinoshita ................. | G03F 1/24 430/5 |
| 2015/0085268 A1 | 3/2015 | Lu et al. | |
| 2015/0140477 A1* | 5/2015 | Singh ........................ | G03F 1/48 430/5 |
| 2015/0331307 A1* | 11/2015 | Lu .............................. | G03F 1/22 430/5 |
| 2016/0238924 A1 | 8/2016 | Burkhardt et al. | |
| 2019/0079383 A1* | 3/2019 | Ikebe ........................ | G03F 1/32 |

FOREIGN PATENT DOCUMENTS

| | | | |
|---|---|---|---|
| KR | 10-2011-0091217 A | 8/2011 | |
| KR | 10-2016-0007331 A | 1/2016 | |
| KR | 20170021191 A * | 2/2017 | ......... H01L 21/0274 |

OTHER PUBLICATIONS

Natalia Davydova, et al. "Impact of an etched EUV mask black border on imaging: part II", Proceedings of SPIE, 2013, pp. 888027-1-888027-12, vol. 8880.

Lieve Van Look, et al., "Experimental validation of novel EUV mask technology to reduce mask 3D effects", BACUS News, Oct. 2015, pp. 1-13, vol. 31, Issue 10.

International Search Report for PCT/KR2020/002774 dated Jun. 4, 2020 [PCT/ISA/210].

Written Opinion for PCT/KR2020/002774 dated Jun. 4, 2020 [PCT/ISA/237].

* cited by examiner

[Fig. 1]
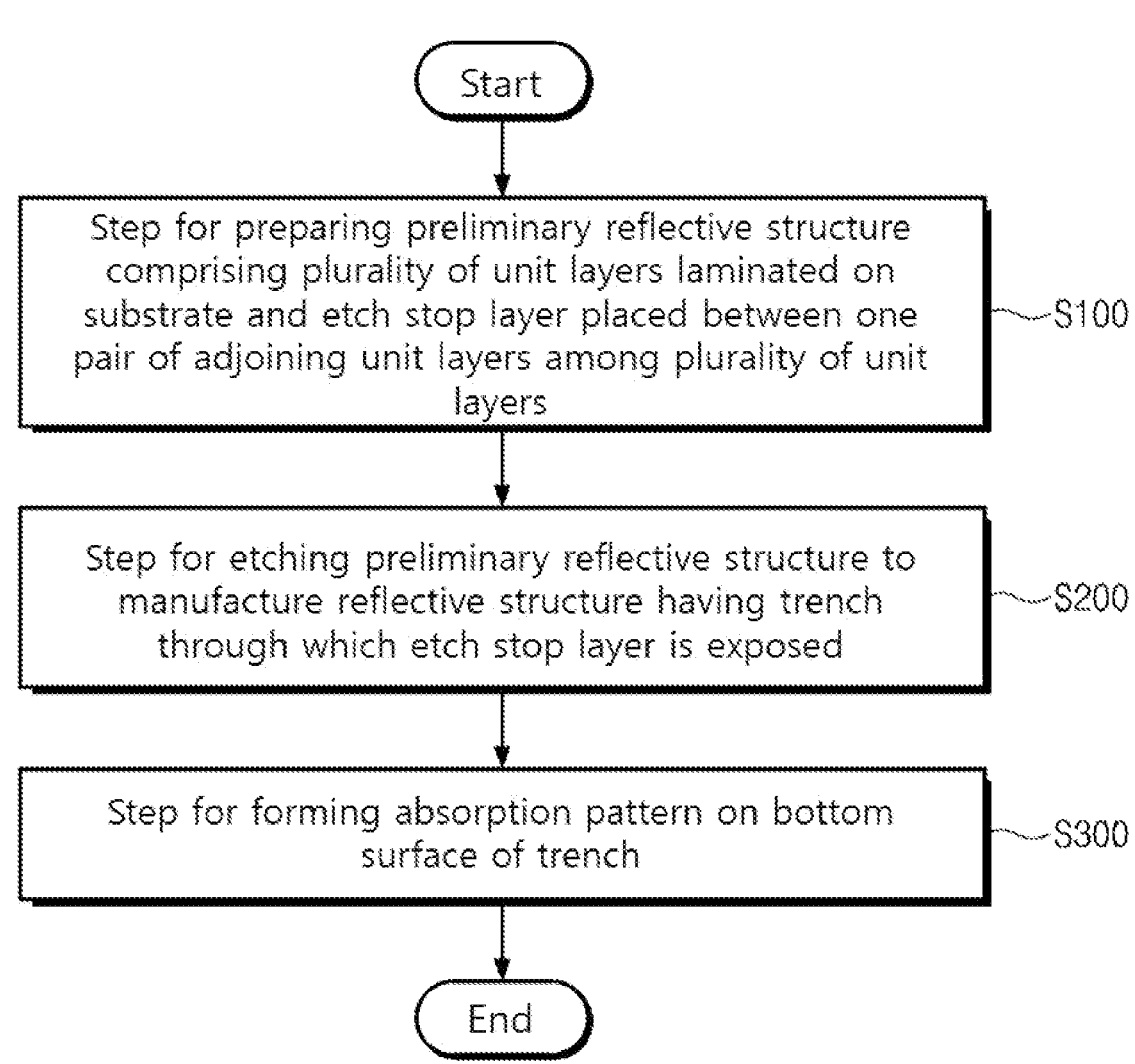

[Fig. 2]
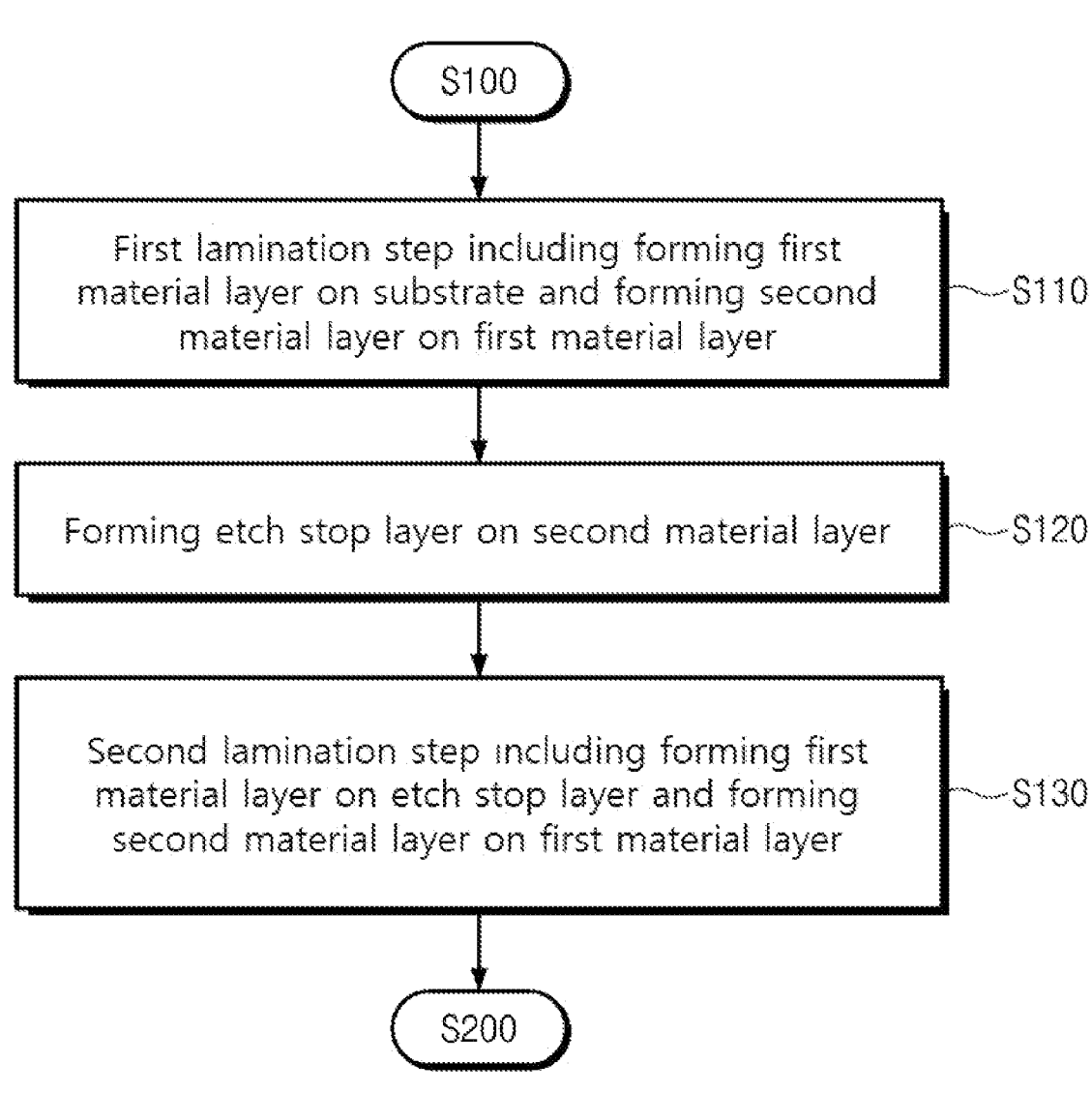

[Fig. 3]
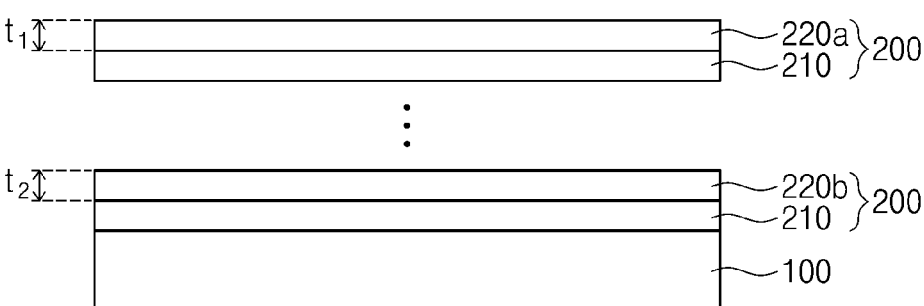

[Fig. 4]
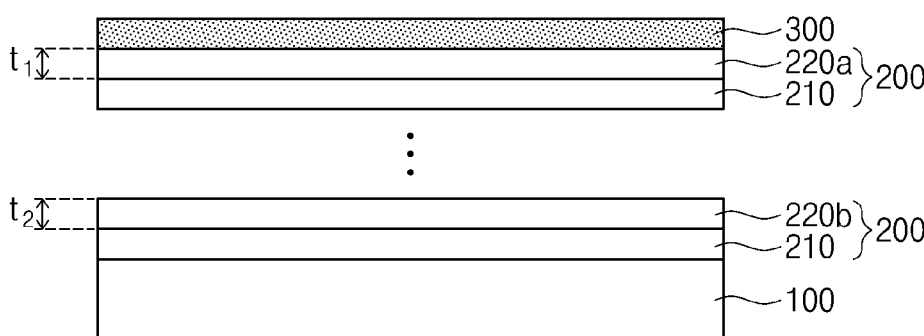

[Fig. 5]
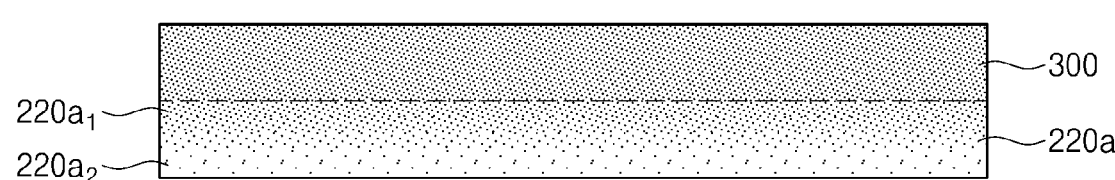

[Fig. 6]
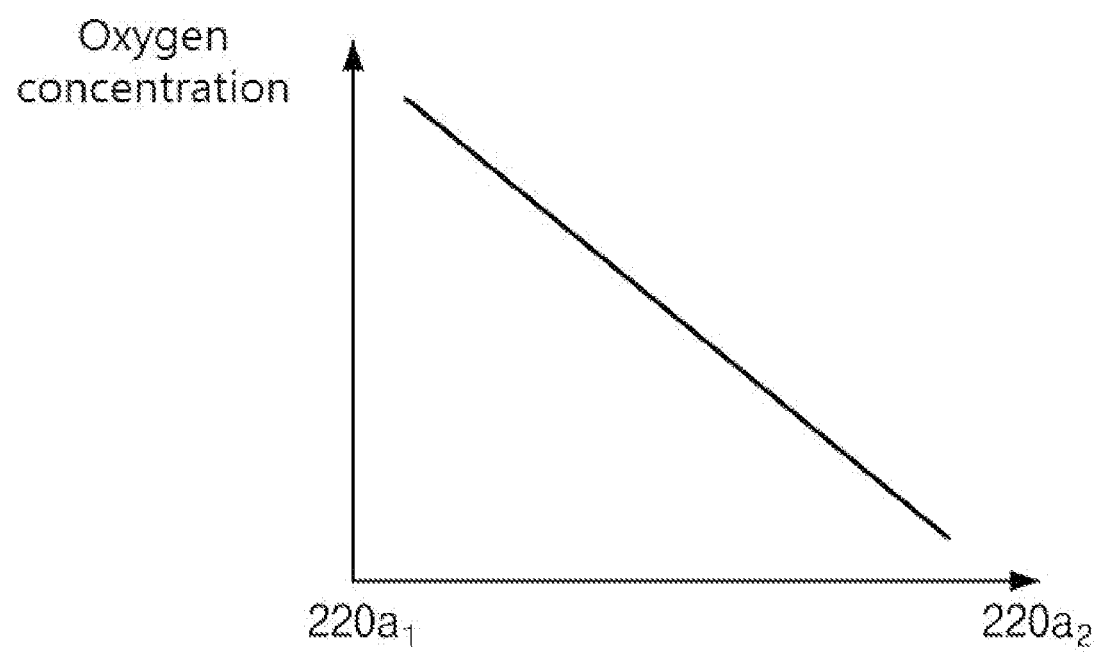

[Fig. 7]
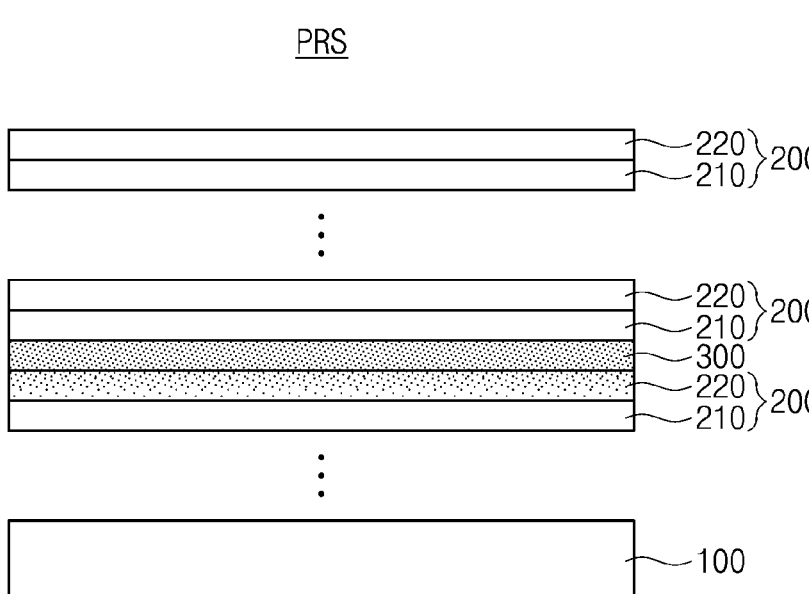
[Fig. 8]
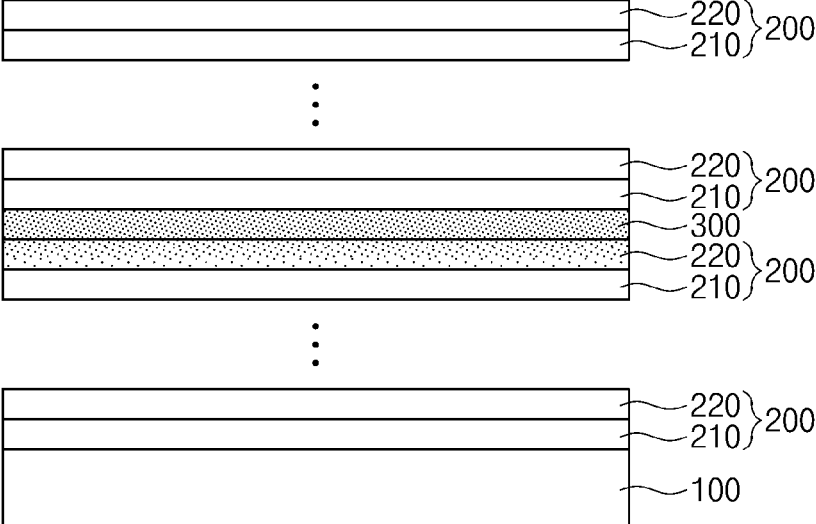

[Fig. 9]
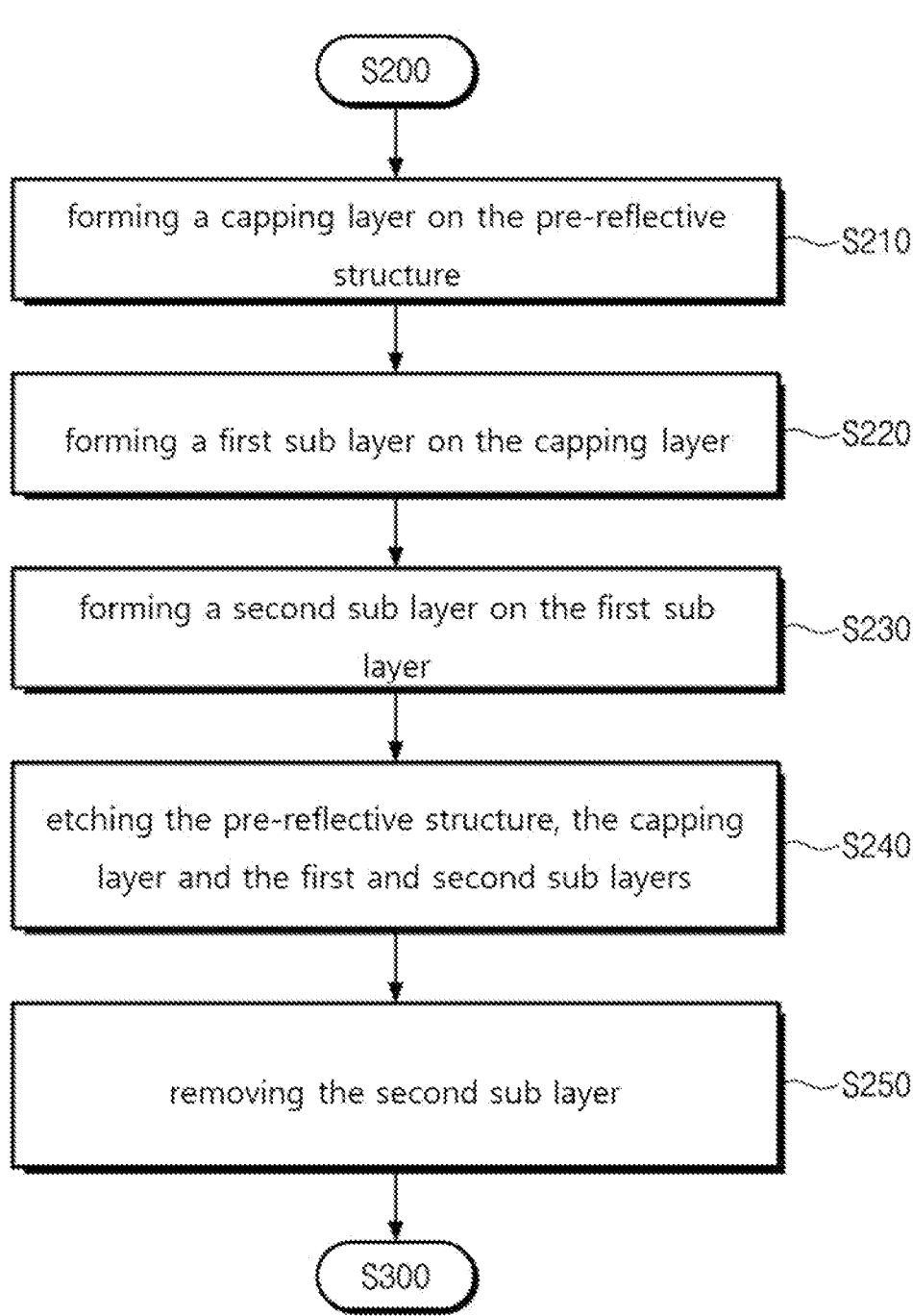

[Fig. 10]
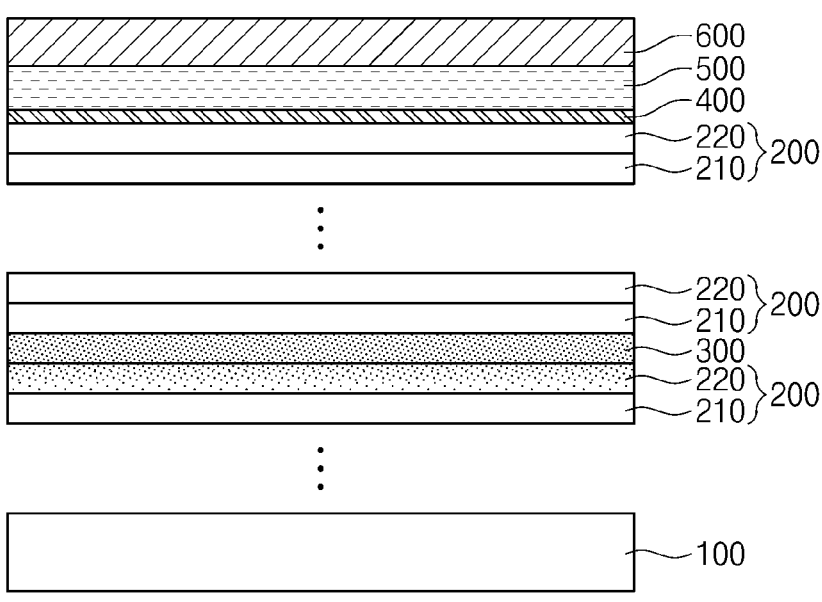

[Fig. 11]
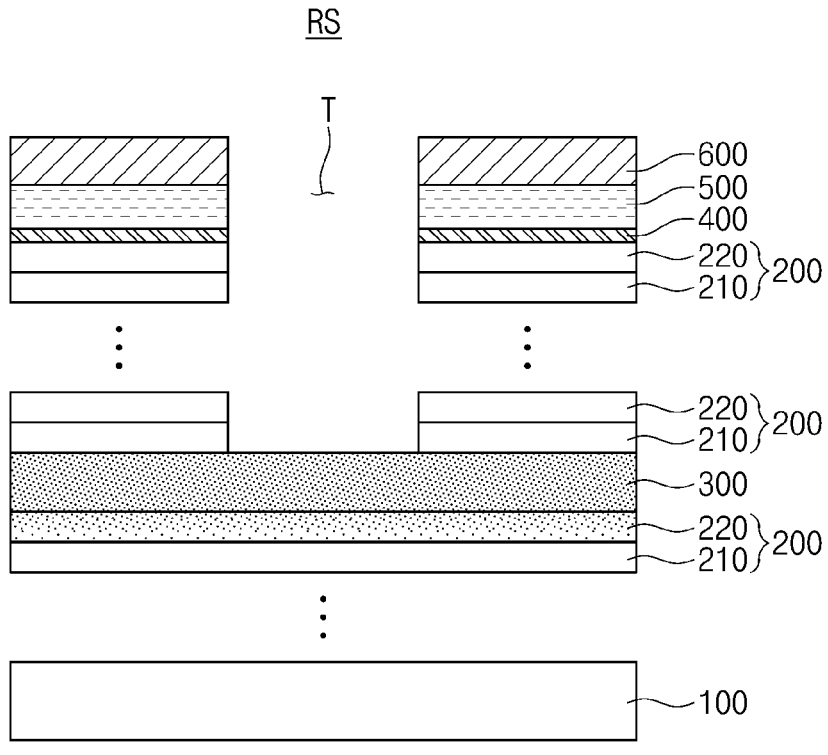

[Fig. 12]
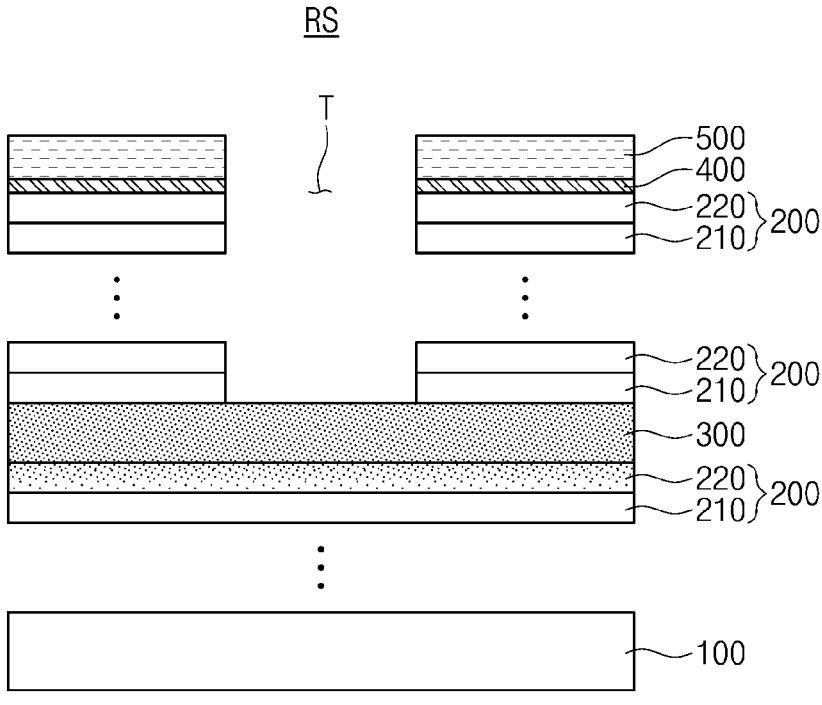

[Fig. 13]
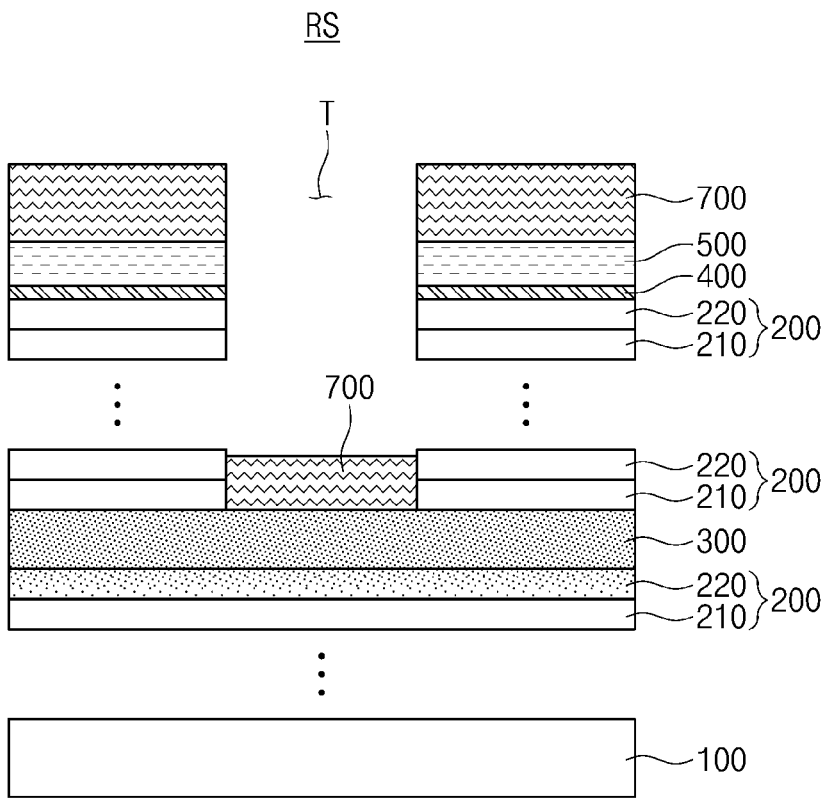

[Fig. 14]
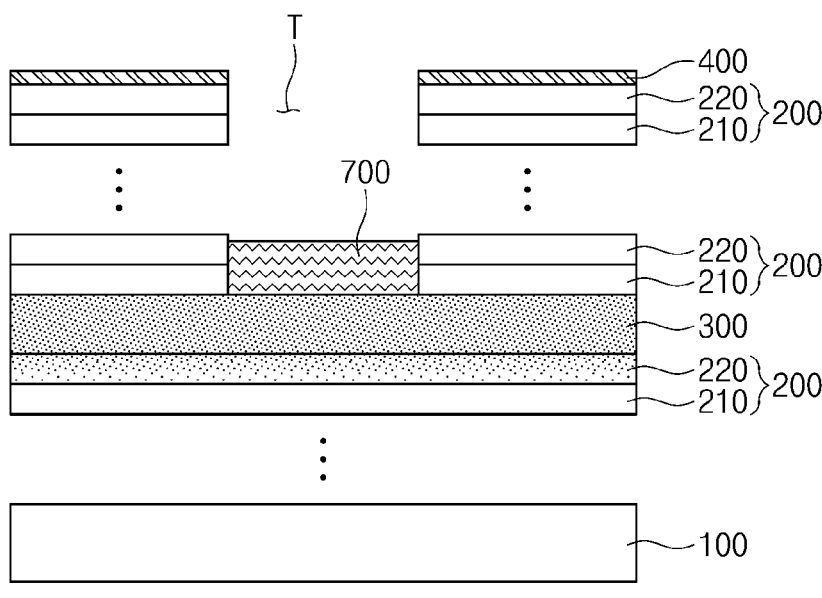
[Fig. 15]
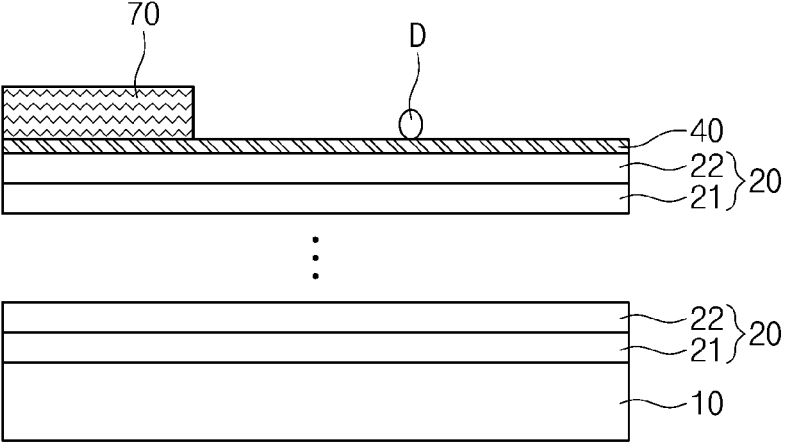

[Fig. 16]
(a)
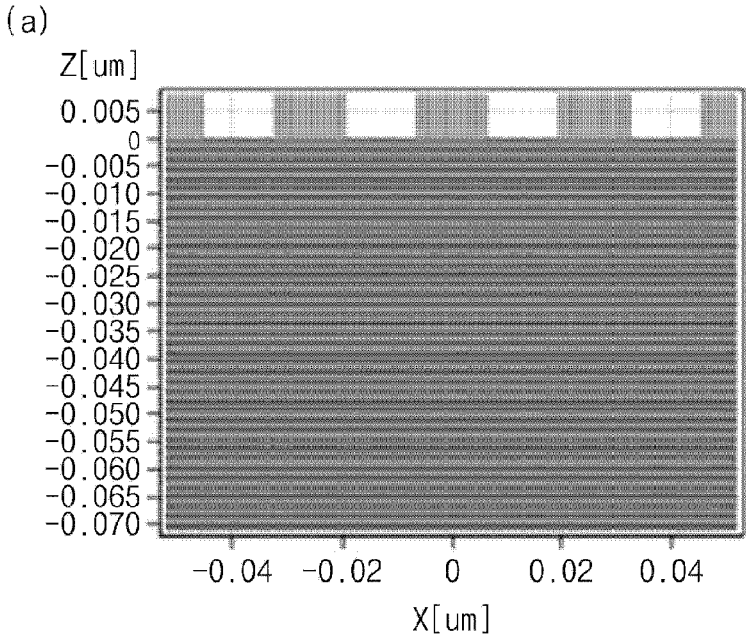
(b)
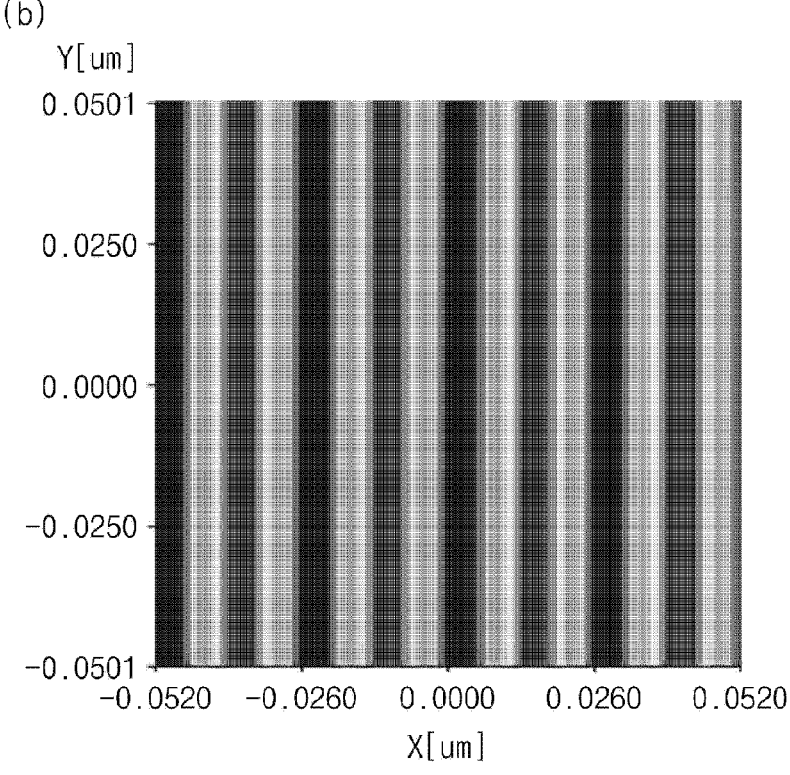

[Fig. 17]
( a )
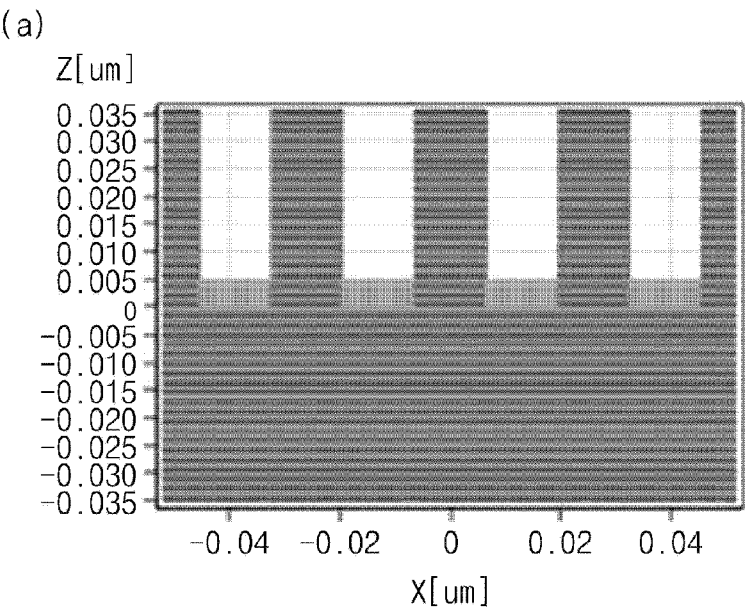
( b )
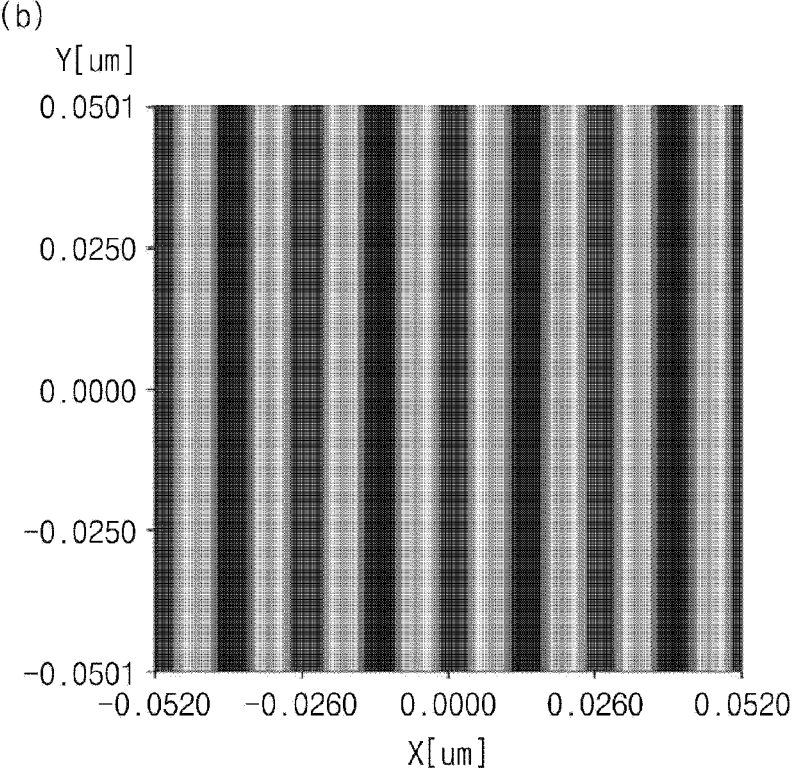

[Fig. 18]
(a)
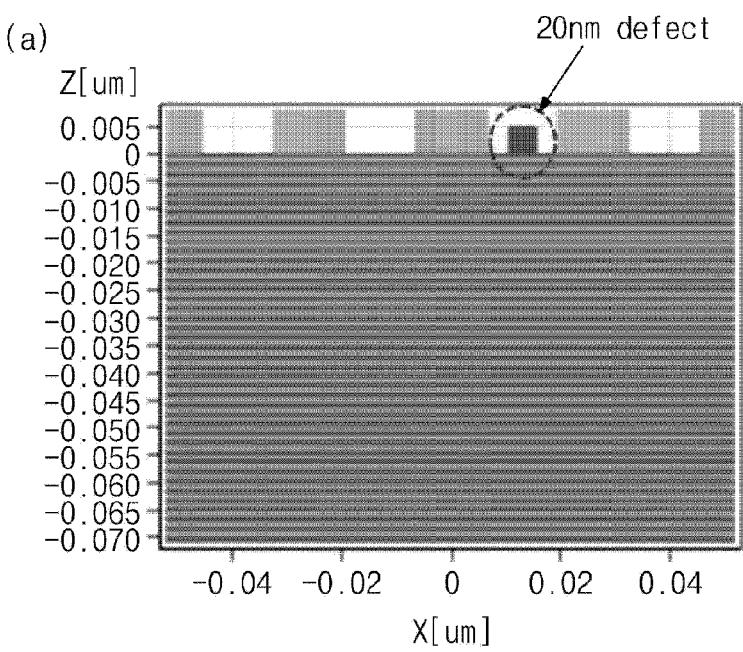
(b)
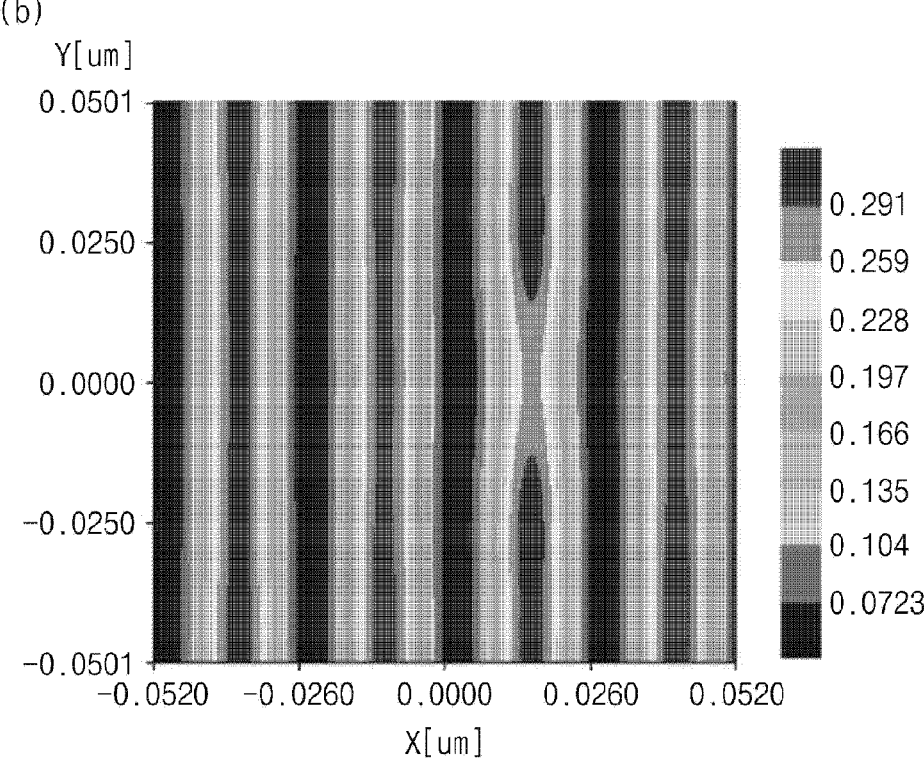

[Fig. 19]
(a)
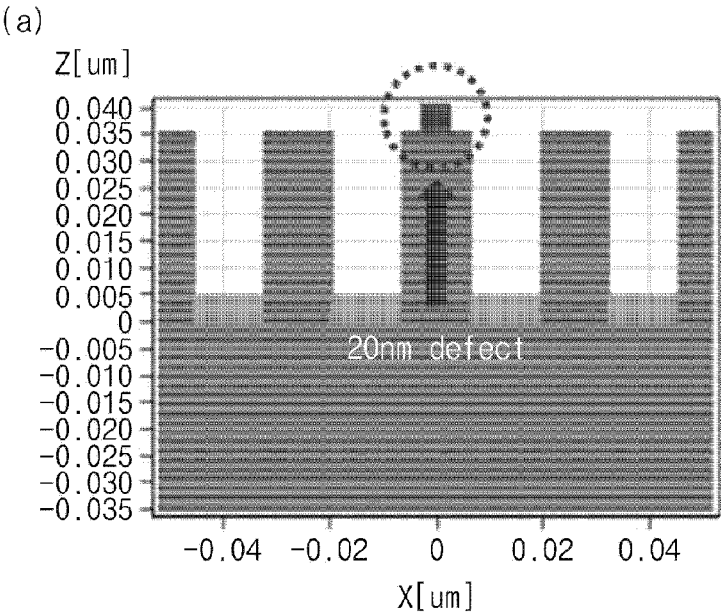
(b)
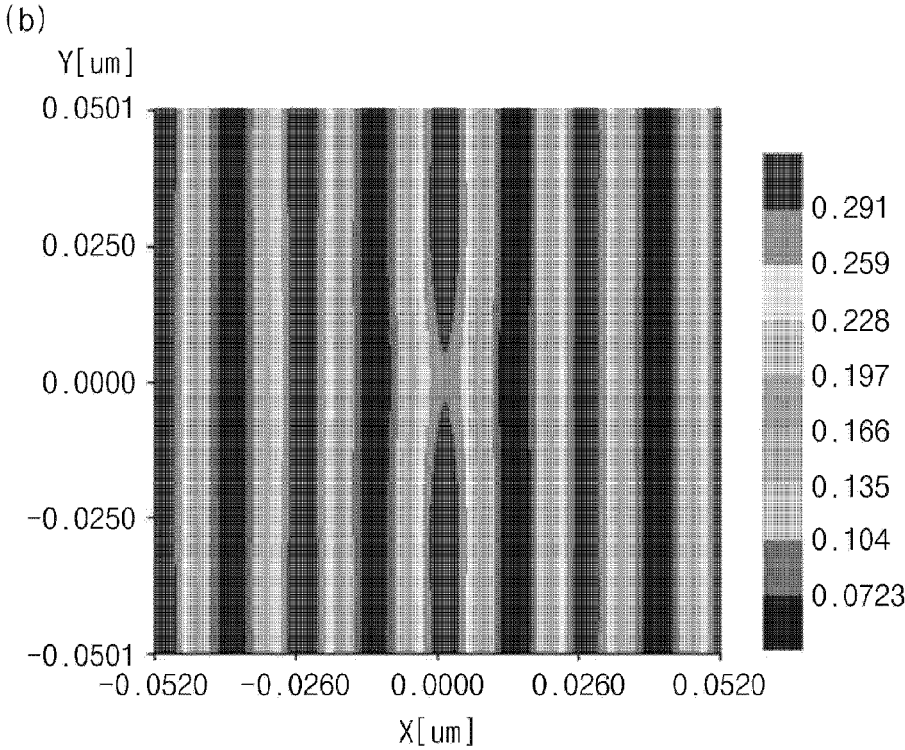

[Fig. 20]
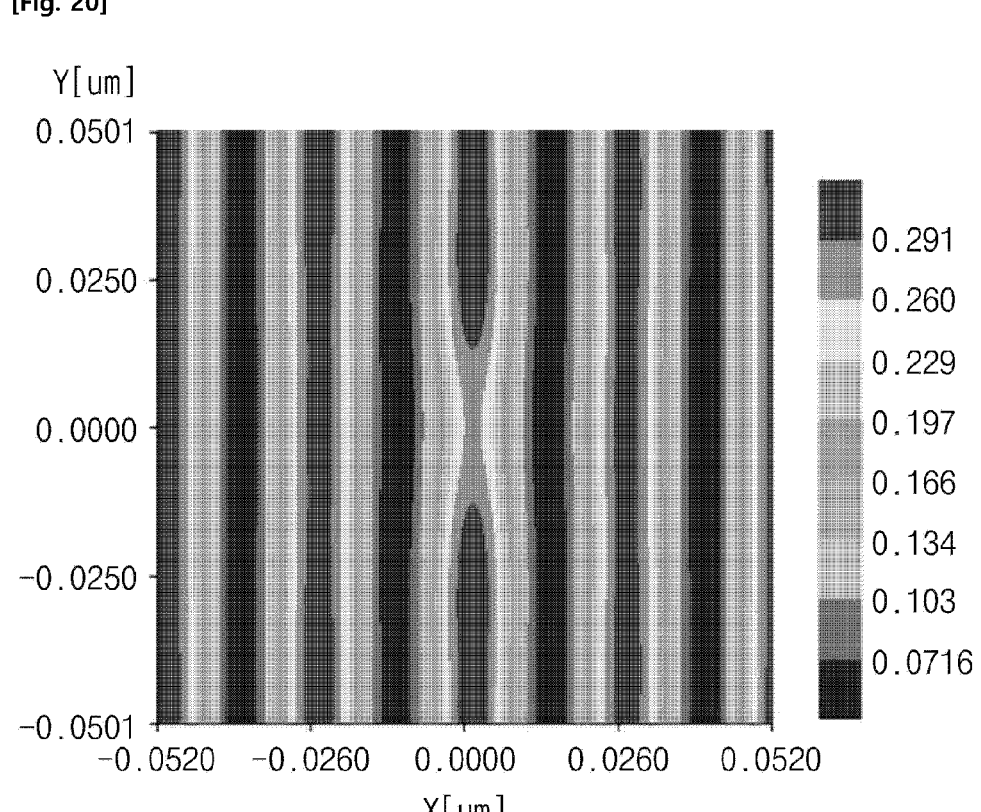

[Fig. 21]
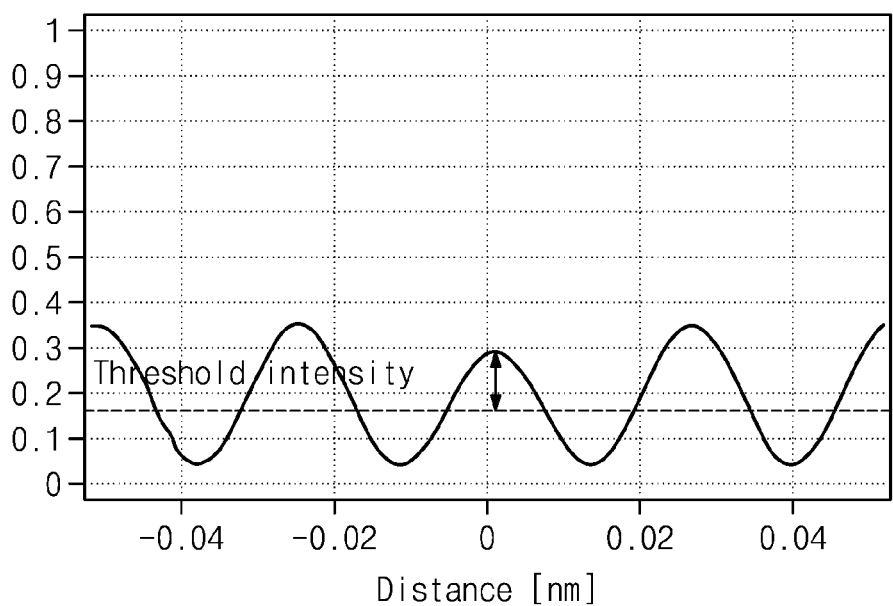
[Fig. 22]
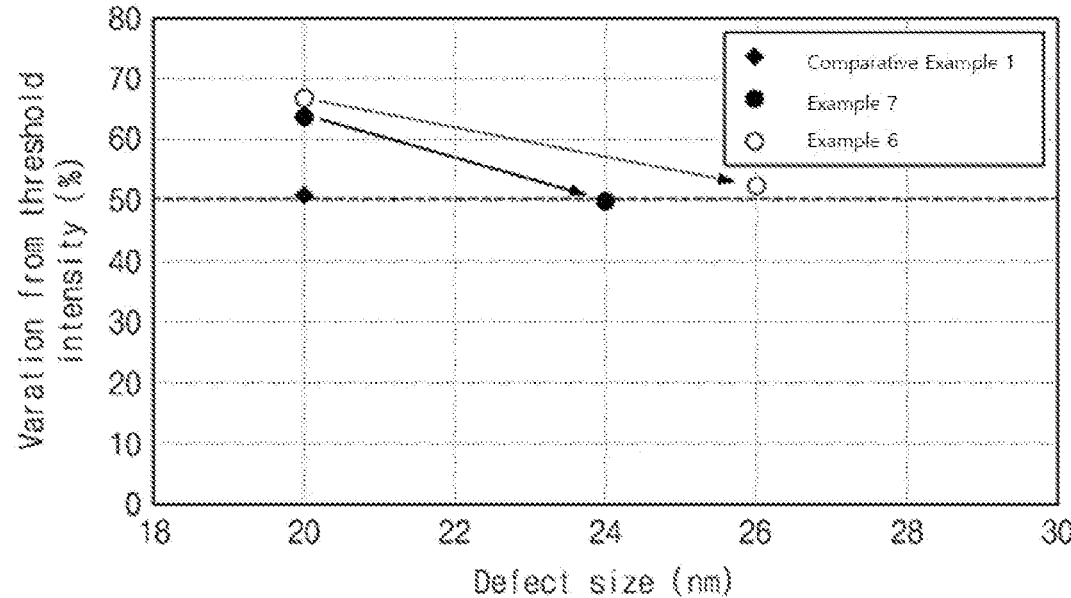

[Fig. 23]
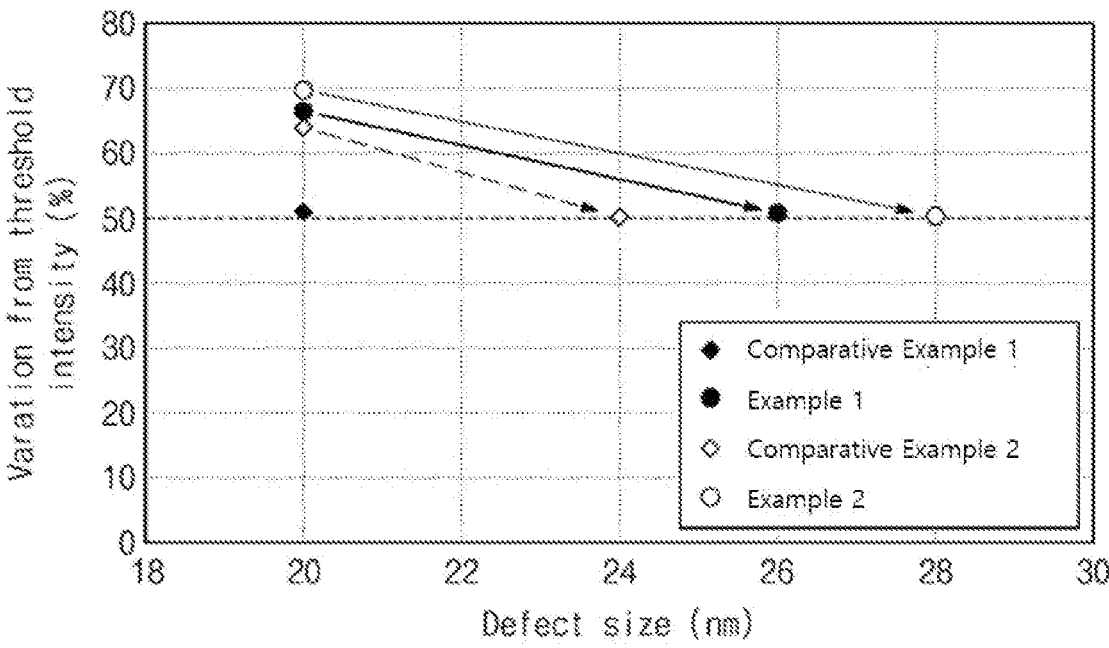

[Fig. 24]
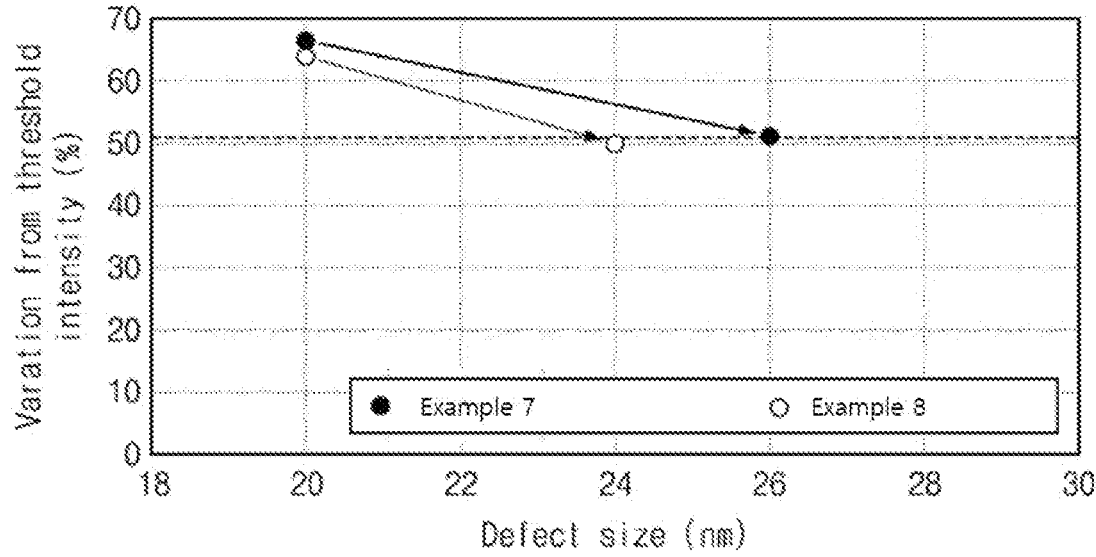
[Fig. 25]
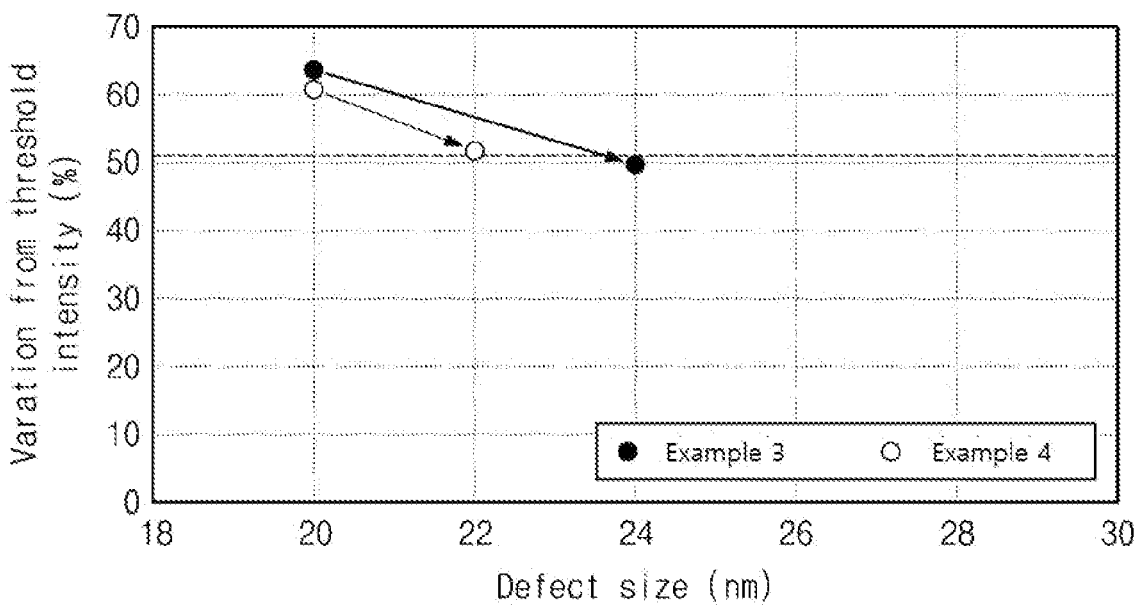

[Fig. 26]
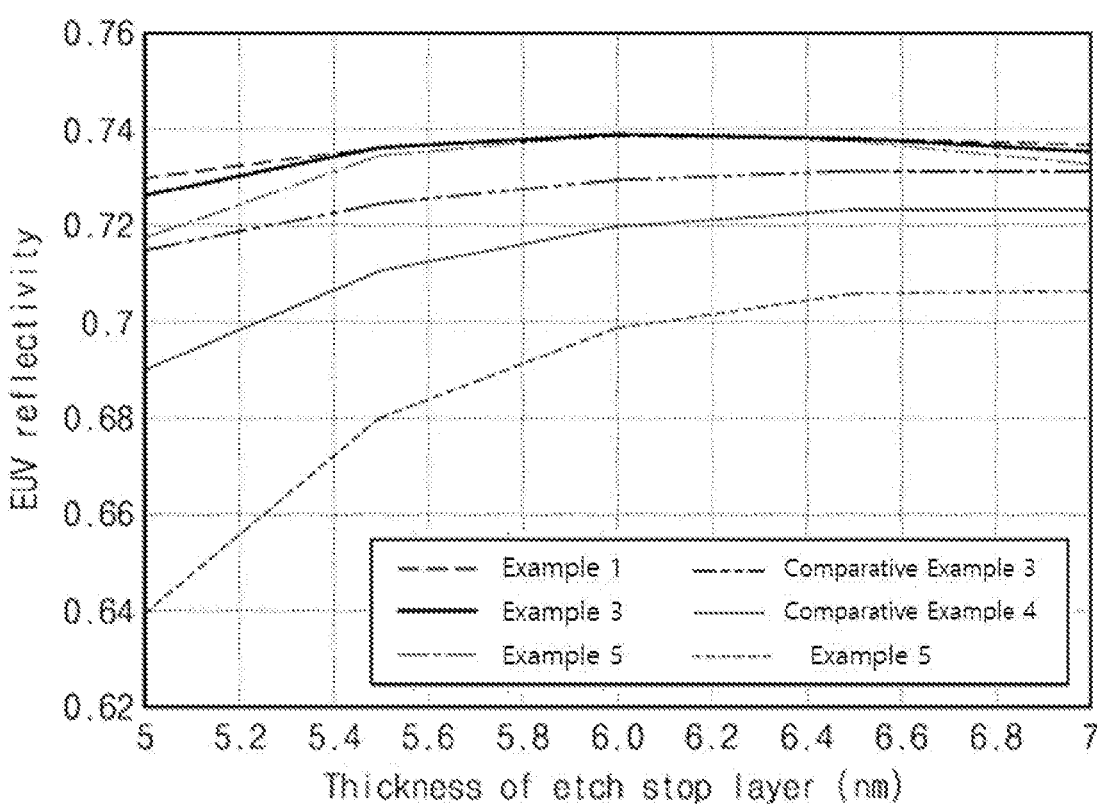

[Fig. 27]
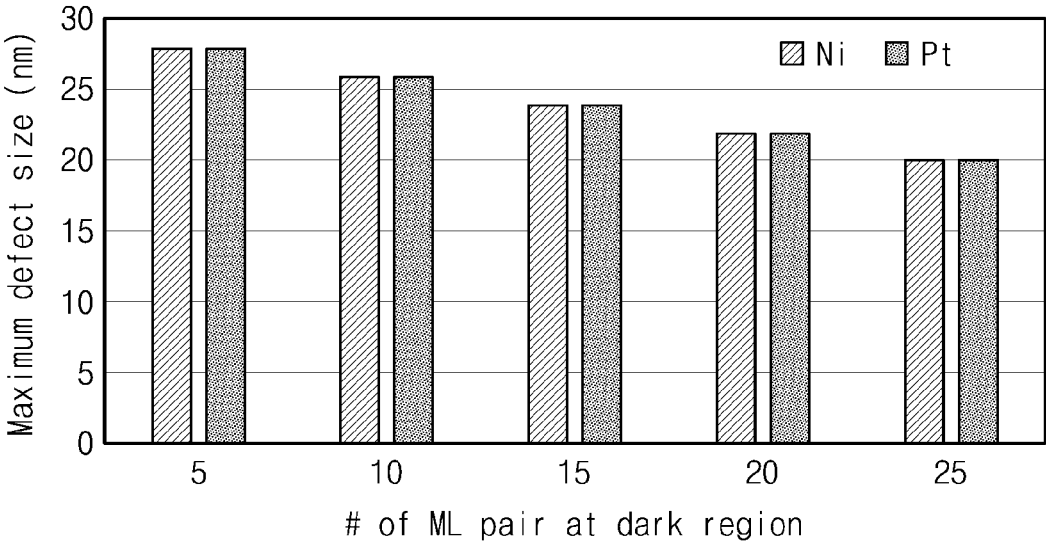
[Fig. 28]
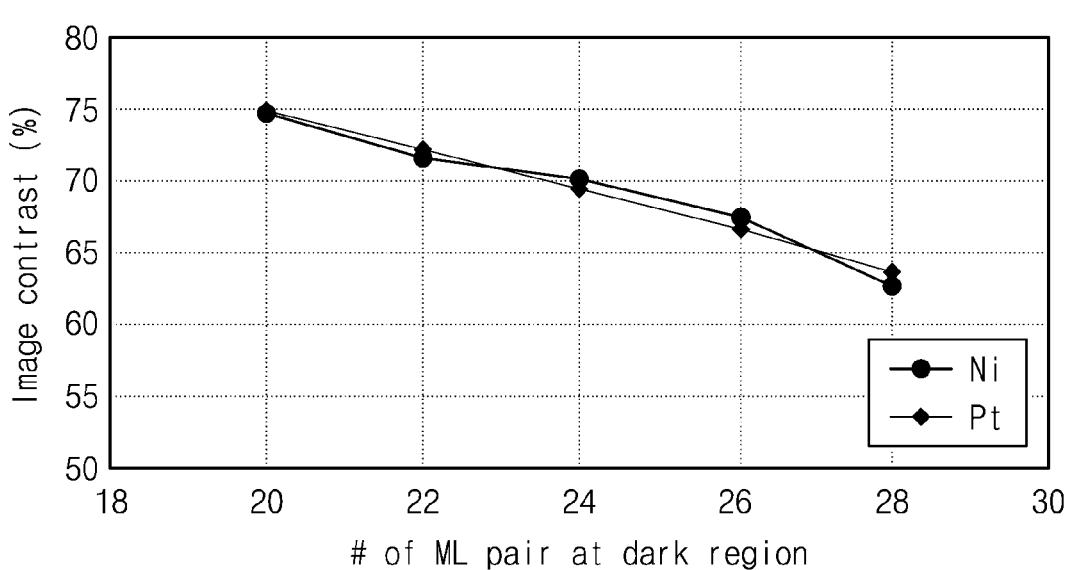

[Fig. 29]
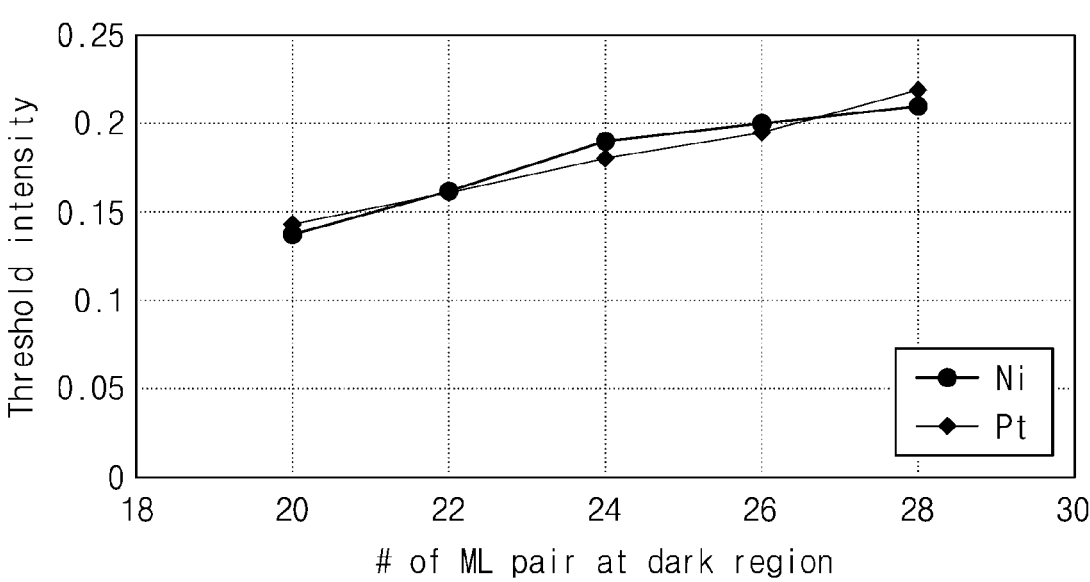

MASK FOR EXTREME ULTRAVIOLET LITHOGRAPHY AND METHOD FOR MANUFACTURING SAME

TECHNICAL FIELD

The present invention relates to a mask for extreme ultraviolet lithography, and a method for manufacturing the same and, more particularly, to a mask for extreme ultraviolet lithography including a plurality of unit layers laminated on a substrate, and a method for manufacturing the same.

BACKGROUND ART

A lithography process is a process directly related to miniaturization and integration of semiconductor devices. In 2008, IC chips with a line width of 38 nm were mass-produced, and then devices with a line width of 30 nm have been mass-produced since 2010. In order to produce a semiconductor device having such a fine line width, there is an extreme ultraviolet (EUV) exposure technique.

The extreme ultraviolet exposure (EUV) process is a next-generation semiconductor exposure technique that is most likely to be applied to a process for mass production of memory semiconductors of 20 nm or less after the 193 nm immersion double patterning technique. Since the extreme ultraviolet exposure (EUV) process uses light with a wavelength of 13.5 nm, a reflective mask is used instead of a transmissive mask. In the case of a conventional mask for general ultraviolet exposure (EUV) process, a tantalum (Ta)-based absorber having a thickness of 70 nm is used in order to maximize a contrast ratio between a reflection area and an absorption area.

However, when a 10 nm-level fine pattern is implemented using a conventional mask, the process capability of the exposure process is insufficient due to a thick absorber structure, thus making it difficult to form a pattern on a wafer. In addition, there is a problem in that the yield of the exposure process is easily lowered because of sensitivity to defects. In order to solve these problems, it is necessary to research and develop a mask for extreme ultraviolet lithography which is insensitive to defects and capable of improving an imaging performance.

DISCLOSURE

Technical Problem

One technical object of the present invention is to provide a mask for extreme ultraviolet lithography which is insensitive to defects, and a method for manufacturing the same.

Another technical object of the present invention is to provide a mask for extreme ultraviolet lithography with an improved imaging performance, and a method for manufacturing the same.

Still another technical object of the present invention is to provide a mask for extreme ultraviolet lithography with improved yield and throughput of an exposure process, and a method for manufacturing the same.

The technical objects of the present invention are not limited to the above.

Technical Solution

To solve the above technical objects, the present invention may provide a mask for extreme ultraviolet lithography.

According to one embodiment, the mask for extreme ultraviolet lithography may include: a reflective structure including a plurality of unit layers laminated on a substrate and an etch stop layer placed between any one pair of adjoining unit layers among the plurality of unit layers, and having a trench through which the etch stop layer is exposed; and an absorption pattern placed on a bottom surface of the trench, wherein the unit layer may include a first material layer and a second material layer on the first material layer.

According to one embodiment, the number of the plurality of unit layers placed under the etch stop layer may be the same as the number of the plurality of unit layers placed over the etch stop layer.

According to one embodiment, the number of the plurality of unit layers placed under the etch stop layer may be smaller than the number of the plurality of unit layers placed over the etch stop layer.

According to one embodiment, a thickness of the etch stop layer may be larger than a thickness of the first material layer or the second material layer.

According to one embodiment, the etch stop layer may include silicon oxide.

According to one embodiment, a thickness of the first material layer may be the same as a thickness of the second material layer.

According to one embodiment, a capping layer placed on the unit layer disposed on an uppermost portion may be further included.

According to one embodiment, the second material layer disposed adjacent to a lower surface of the etch stop layer may be divided into an upper area adjacent to an upper surface of the second material layer and a lower area adjacent to a lower surface of the second material layer, and a concentration of oxygen (O) may gradually decrease from the upper area to the lower area.

To solve the above technical objects, the present invention may provide a method for manufacturing a mask for extreme ultraviolet lithography.

According to one embodiment, the method for manufacturing a mask for extreme ultraviolet lithography may include the steps of: preparing a pre-reflective structure including a plurality of unit layers laminated on a substrate and an etch stop layer placed between any one pair of adjoining unit layers among plurality of unit layers; etching the pre-reflective structure to manufacture a reflective structure having a trench through which the etch stop layer is exposed; and forming an absorption pattern on a bottom surface of the trench.

According to one embodiment, the preparing of the pre-reflective structure may include: a first lamination step including forming a first material layer on the substrate and forming a second material layer on the first material layer; forming the etch stop layer on the second material layer; and a second lamination step including forming the first material layer on the etch stop layer and forming the second material layer on the first material layer, wherein the first lamination step and the second lamination step may be repeated a plurality of times.

According to one embodiment, in the plurality of second material layers formed in the first lamination step, a thickness of the second material layer formed on an uppermost portion may be larger than a thickness of the second material layer excluding the second material layer formed on the uppermost portion and may have a thickness of more than 3.6 nm.

According to one embodiment, the number of repeating the first lamination step may be less than or equal to the number of repeating the second lamination step.

According to one embodiment, in the manufacturing of the reflective structure, the etch stop layer may include an etch selection ratio compared to the first material layer and the second material layer for an etch source provided to the pre-reflective structure.

According to one embodiment, the forming of the etch stop layer may include thermally oxidizing the second material layer of the uppermost portion in the first lamination step, and oxygen (O) may penetrate into the second material layer of the uppermost portion to form an oxygen concentration gradient inside the second material layer of the uppermost portion while the second material layer of an uppermost portion is thermally oxidized.

Advantageous Effects

According to an embodiment of the present invention, a mask for extreme ultraviolet lithography may include: a reflective structure including a plurality of unit layers laminated on a substrate and an etch stop layer placed between any one pair of adjoining unit layers among the plurality of unit layers, and having a trench through which the etch stop layer is exposed; and an absorption pattern placed on a bottom surface of the trench, wherein the unit layer may include a first material layer and a second material layer on the first material layer.

If the mask according to the embodiment is defective, a defect may be formed on the capping layer, and thus the absorption pattern and the defect may be disposed on different planes. Accordingly, if an aerial image is obtained by using the mask according to the embodiment, the defect may be focused out to increase a difference between the light intensity of an area where the defect is formed (defect area) and a threshold light intensity of an area where the defect is not formed, thereby providing an insensitive property to a fine defect. As a result, an imaging performance may be improved to increase the yield and throughput of an exposure process.

DESCRIPTION OF DRAWINGS

FIG. 1 is a flowchart for explaining a method for manufacturing a mask for extreme ultraviolet lithography according to an embodiment of the present invention.

FIG. 2 is a flowchart for specifically explaining a step of preparing a pre-reflective structure in a method for manufacturing a mask for extreme ultraviolet lithography according to an embodiment of the present invention.

FIG. 3 is a view showing a first lamination step in a method for manufacturing a mask for extreme ultraviolet lithography according to an embodiment of the present invention.

FIGS. 4 and 5 are views showing a step of forming an etch stop layer in a method for manufacturing a mask for extreme ultraviolet lithography according to an embodiment of the present invention.

FIG. 6 is a graph showing a concentration difference in an etch stop layer.

FIGS. 7 and 8 are views showing a pre-reflective structure prepared in a method for manufacturing a mask for extreme ultraviolet lithography according to an embodiment of the present invention.

FIG. 9 is a flowchart for specifically explaining a step of forming a reflective structure in a method for manufacturing a mask for extreme ultraviolet lithography according to an embodiment of the present invention.

FIGS. 10 to 14 are views showing a method for manufacturing a mask for extreme ultraviolet lithography according to an embodiment of the present invention.

FIG. 15 is a view showing a conventional mask for extreme ultraviolet lithography.

FIG. 16 is a schematic view and an aerial image of a mask for extreme ultraviolet lithography according to Comparative Example 1 of the present invention.

FIG. 17 is a schematic view and an aerial image of a mask for extreme ultraviolet lithography according to Example 1 of the present invention.

FIG. 18 is a schematic view and an aerial image of a mask for extreme ultraviolet lithography according to Comparative Example 1 of the present invention, when the mask has a defect.

FIGS. 19 and 20 are a schematic view and an aerial image of a mask for extreme ultraviolet lithography according to Example 1 of the present invention, when the mask has a defect.

FIG. 21 is a graph showing a difference between intensity and threshold intensity in a defect area of a mask for extreme ultraviolet lithography.

FIG. 22 is a graph comparing the properties of masks for extreme ultraviolet lithography according to Example 6, Example 7, and Comparative Example 1 of the present invention.

FIG. 23 is a graph comparing the properties of masks for extreme ultraviolet lithography according to Example 1, Example 2, Comparative Example 1, and Comparative Example 2 of the present invention.

FIG. 24 is a graph comparing the properties of masks for extreme ultraviolet lithography according to Example 7 and Example 8 of the present invention.

FIG. 25 is a graph comparing the properties of masks for extreme ultraviolet lithography according to Example 3 and Example 4 of the present invention.

FIG. 26 is a graph showing the properties of an etch stop layer included in a mask for extreme ultraviolet lithography according to an embodiment of the present invention.

FIGS. 27 to 29 are graphs for confirming the optimal number of etch stop layers disposed under the etch stop layer included in a mask for extreme ultraviolet lithography according to an embodiment of the present invention.

MODE FOR INVENTION

Hereinafter, preferred embodiments of the present invention will be described in detail with reference to the accompanying drawings. However, the technical idea of the present invention is not limited to the embodiments described herein and may be embodied in other forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present specification, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combinations thereof described in the specification are present, and are not to be understood as excluding the possibility that one or more other features, numbers, steps, elements, or combinations thereof may be present or added. In addition, the term "connection" used herein may include the meaning of indirectly connecting a plurality of components, and directly connecting a plurality of components.

Further, in the following description of the present invention, a detailed description of known functions or configurations incorporated herein will be omitted when it may make the subject matter of the present invention unnecessarily unclear.

FIG. 1 is a flowchart for explaining a method for manufacturing a mask for extreme ultraviolet lithography according to an embodiment of the present invention, FIG. 2 is a flowchart for specifically explaining a step of preparing a pre-reflective structure in a method for manufacturing a mask for extreme ultraviolet lithography according to an embodiment of the present invention, FIG. 3 is a view showing a first lamination step in a method for manufacturing a mask for extreme ultraviolet lithography according to an embodiment of the present invention, FIGS. 4 and 5 are views showing a step of forming an etch stop layer in a method for manufacturing a mask for extreme ultraviolet lithography according to an embodiment of the present invention, FIG. 6 is a graph showing a concentration difference in an etch stop layer, and FIGS. 7 and 8 are views showing a pre-reflective structure prepared in a method for manufacturing a mask for extreme ultraviolet lithography according to an embodiment of the present invention.

Referring to FIGS. 1 to 8, a pre-reflective structure (PRS) may be prepared (S100). According to one embodiment, the preparing of the pre-reflective structure (PRS) may include a first lamination step (S110), an etch stop layer forming step (S120), and a second lamination step (S130). Hereinafter, each of the steps will be described in more detail.

The first lamination step (S110) may include a step of forming a first material layer 210 on a substrate 100, and a step of forming second material layers 220a and 220b on the first material layer 210. For example, the substrate 100 may be transparent. For example, the first material layer 210 may include molybdenum (Mo). For example, the second material layers 210a and 210b may include silicon (Si).

The first material layer 210 and the second material layers 220a and 220b formed on the first material layer 210 may be defined as a unit layer 200. In other words, the unit layer 200 may be formed on the substrate 110 through the first lamination step. According to one embodiment, the first lamination step may be repeatedly performed a plurality of times. Accordingly, the plurality of unit layers 200 may be formed on the substrate 110.

According to one embodiment, a thickness of the first material layer 210 may be the same as a thickness of the second material layers 220a and 220b. According to another embodiment, a thickness of the first material layer 210 may be different from a thickness of the second material layers 220a and 220b. For example, a thickness ratio between the first material layer 210 and the second material layer 220 may be 5:5 to 7:3. Specifically, a thickness of the first material layer 210 may be 3.5 nm to 4.9 nm. In contrast, a thickness of the second material layers 220a and 220b may be 2.1 nm to 3.5 nm.

According to one embodiment, a thickness $t_1$ of the second material layer 220a of an uppermost portion among the plurality of unit layers 200 formed on the substrate 100 may be larger than a thickness $t_2$ of the second material layer 200b below an uppermost portion. In this case, in the forming of an etch stop layer 300 on the second material layer 220a of an uppermost portion (S120) to be described later, if the etch stop layer 300 is formed through a thermal oxidation process, a thickness $t_1$ of the second material layer 200a of the uppermost portion may be decreased, and thus a thickness of the second material layer 200a of the uppermost portion may become the same as a thickness $t_2$ of the second material layer below the uppermost portion, and a thickness of the first material layer 210. More specific description will be provided below.

Alternatively, according to another embodiment, a thickness $t_2$ of the second material layer 220a of an uppermost portion among the plurality of unit layers 200 formed on the substrate 100 may be the same as a thickness $t_2$ of the second material layer 200b below an uppermost portion.

After the first lamination step (S110), the etch stop layer 300 may be formed on the second material layer 220a of the uppermost portion (S120). In the manufacturing of the reflective structure to be described later, the etch stop layer 300 may be formed of a material having an etch selection ratio compared to the first material layer 210 and the second material layer 220 for an etch source provided to the pre-reflective structure (PRS). In this regard, specific description will be provided below.

According to one embodiment, the etch stop layer 300 may be formed as the second material layer 220a of the uppermost portion is thermally oxidized. Accordingly, the etch stop layer 300 may include silicon oxide. For example, the etch stop layer 300 may include $SiO_2$.

While the second material layer 220a of the uppermost portion is thermally oxidized to form the etch stop layer 300, oxygen (O) may penetrate into the second material layer 220a of the uppermost portion. Accordingly, an oxygen concentration gradient may be formed inside the second material layer 220a of the uppermost portion. As a result, as shown in FIGS. 5 and 6, the second material layer 200a of the uppermost portion may show a decrease in an oxygen (O) concentration from an upper area $200a_1$ adjacent to an upper surface to a lower area $200a_2$ adjacent to a lower surface.

In addition, if the second material layer 220a of the uppermost portion is thermally oxidized, oxygen may penetrate into the second material layer 200a of the uppermost portion, and thus a part of the second material layer 200a of the uppermost portion may be formed of the etch stop layer 300. Accordingly, a thickness $t_1$ of the second material layer 200a of the uppermost portion may be decreased. As a result, a thickness $t_1$ of the second material layer 200a of the uppermost portion may be formed to be larger than a thickness $t_2$ of the second material layer 200b included in the plurality of unit layers 200 formed in other portions excluding the uppermost portion as described above, so that the thickness $t_1$ of the second material layer 200a of the uppermost portion can become the same as the thickness $t_2$ of the second material layer 200b below the uppermost portion Unlike the above, according to another embodiment, the etch stop layer 300 may be formed through a deposition process. For example, the etch stop layer 300 may be formed through a chemical vapor deposition (CVD), a physical vapor deposition (PVD), an atomic layer deposition (ALD) and the like.

According to one embodiment, an extreme ultraviolet (EUV) reflectivity of the etch stop layer 300 may be controlled by controlling a thickness of the etch stop layer 300. Specifically, if the thickness of the etch stop layer 300 is larger than the thickness of the first material layer 210 and the second material layer 220, the extreme ultraviolet reflectivity of the etch stop layer 300 may be improved. For example, if the thickness of the etch stop layer 300 is 5.45 nm to 6.6 nm, the extreme ultraviolet reflectivity of the etch stop layer 300 may be improved. The extreme ultraviolet reflectivity of the etch stop layer 300 may affect the extreme ultraviolet reflectivity of a reflective structure to be described later. In other words, if the extreme ultraviolet reflectivity of the etch stop layer 300 is decreased, the extreme ultraviolet reflectivity of the reflective structure to be described later may be decreased to cause a problem in which the extreme ultraviolet reflectivity of a final mask for extreme ultraviolet lithography mask is decreased. Accordingly, the reflectivity of the mask for extreme ultraviolet lithography may be maintained high by controlling the thickness of the etch stop layer 300.

Referring to FIGS. 7 and 8, the second lamination step (S130) may be performed after the step of forming the etch stop layer 300 (S120). Accordingly, the pre-reflective structure (PRS) may be formed.

The second lamination step (S130) may include a step of forming the first material layer 210 on the etch stop layer 300, and a step of forming a second material layer 220 on the first material layer 210. In other words, the unit layer 200 may be formed on the etch stop layer 300 through the second lamination step. According to one embodiment, the second lamination step may be repeatedly performed a plurality of times. Accordingly, the plurality of unit layers 200 may be formed on the etch stop layer 300. As a result, the pre-reflective structure (PRS) may include the plurality of unit layers 200 laminated on the substrate 100, and the etch stop layer 300 placed between any one pair of adjoining unit layers among plurality of unit layers.

According to one embodiment, the number of repeating the second lamination step (S130) may be the same as the number of repeating the first lamination step (S110). Accordingly, the number of the plurality of unit layers 200 disposed under the etch stop layer 300 may be the same as the number of the plurality of unit layers 200 disposed over the etch stop layer 300. For example, both the number of the plurality of unit layers 200 disposed under the etch stop layer 300, and the number of the plurality of unit layers 200 disposed over the etch stop layer 300 may be 20.

According to another embodiment, the number of repeating the second lamination step (S130) may be larger than the number of repeating the first lamination step (S110). Accordingly, the number of the plurality of unit layers 200 disposed under the etch stop layer 300 may be smaller than the number of the plurality of unit layers 200 disposed over the etch stop layer 300. For example, the number of the plurality of unit layers 200 disposed over the etch stop layer 300 may be 20, and the number of the plurality of unit layers 200 disposed under the etch stop layer 300 may be less than 20.

In contrast, 20 or less unit layers 200 may be disposed over the etch stop layer 300. Unlike the above, if the number of the plurality of unit layers 200 disposed over the etch stop layer 300 is more than 20, there may be a problem in which the plurality of unit layers 200 disposed over the etch stop layer 300 may collapse after a step of etching a pre-reflective structure to be described later.

FIG. 9 is a flowchart for specifically explaining a step of forming a reflective structure in a method for manufacturing a mask for extreme ultraviolet lithography according to an embodiment of the present invention, FIGS. 10 to 14 are views showing a method for manufacturing a mask for extreme ultraviolet lithography according to an embodiment of the present invention, and FIG. 15 is a view showing a conventional mask for extreme ultraviolet lithography.

As described above, the pre-reflective structure (PRS) may include the plurality of unit layers 200 over and under the etch stop layer 300. Hereinafter, in describing the method for manufacturing a mask for extreme ultraviolet lithography according to the embodiment, the pre-reflective structure (PRS) in which one of the unit layers 200 is disposed under the etch stop layer 300 and two of the unit layers 200 are disposed over the etch stop layer 300, will be described as an example. The number of the unit layers 200 disposed over and under the etch stop layer 300 is not limited.

Referring to FIGS. 1, and 9 to 12, the reflective structure (RS) may be manufactured (S200) by etching the pre-reflective structure (PRS). According to one embodiment, the manufacturing of the reflective structure (RS) may include forming a capping layer 400 on the pre-reflective structure (PRS) (S210), forming a first sub layer 500 on the capping layer 400 (S220), forming a second sub layer 600 on the first sub layer 500 (S230), etching the pre-reflective structure (PRS), the capping layer 400 and the first and second sub layers 500 and 600, and removing the second sub layer 600 (S250). Hereinafter, each of the steps will be described in detail.

In above step S210, the capping layer 400 may be formed on the pre-reflective structure (PRS). More specifically, among the plurality of unit layers 200 included in the pre-reflective structure (PRS), the capping layer 400 may be formed on the unit layer 200 disposed on an uppermost portion of the substrate 100. For example, the capping layer 400 may include any one of ruthenium (Ru), niobium oxide (NbO), ruthenium oxide (RuO), and titanium oxide (TiO).

Through above steps S220 and S230, the first sub layer 500 and the second sub layer 600 may be sequentially formed on the capping layer 400. According to one embodiment, the first sub layer 500 may include a lift-off material. In contrast, the second sub layer 600 may include E-beam resist.

In above step S240, the pre-reflective structure (PRS), the capping layer 400, the first sub layer 500 and the second sub layer 600 may be etched as shown in FIG. 11. According to one embodiment, above step S240 may be performed by a dry etching process.

As described above, the etch stop layer 300 may have an etch selection ratio compared to the first material layer 210 and the second material layer 220 for an etch source provided by the etching process. In other words, the first material layer 210 and the second material layer 220 may react with the etch source and thus may be etched. In contrast, the etch stop layer 300 may not react with the etch source and thus may not be substantially etched.

Accordingly, the plurality of unit layers 200 disposed on an upper surface of the etch stop layer 300 may be etched, but the plurality of unit layers 200 disposed on a lower surface of the etch stop layer 300 may not be etched. As a result, if the pre-reflective structure (PRS) is etched in above step S240, the reflective structure (RS) including a trench T through which the etch stop layer 300 is exposed may be formed.

In above step S250, after the reflective structure (RS) is formed through above step S240, the second sub layer 600 may be removed as shown in FIG. 12. According to one embodiment, the second sub layer 600 may be removed through a photo resist (PR) process.

Referring to FIGS. 1, 13 and 15, an absorption pattern 700 may be formed on a bottom surface of the trench T (S300). Accordingly, the mask for extreme ultraviolet lithography according to the embodiment may be manufactured. In other words, the mask for extreme ultraviolet lithography according to the embodiment may include: the reflective structure (RS) including the plurality of unit layers 200 laminated on the substrate 100 and the etch stop layer 300 placed between any one pair of adjoining unit layers among the plurality of unit layers 200, and having the trench T through which the etch stop layer 300 is exposed; the absorption pattern 700 placed on a bottom surface of the trench T; and the capping layer 400 placed on the unit layer 200 disposed on an uppermost portion of the substrate 100.

According to one embodiment, the forming of the absorption pattern 700 may include forming an absorption pattern 700 on the first sub layer 500 and a bottom surface of the trench T, and removing the absorption pattern 700 formed on the first sub layer 500 together with the first sub layer 500 by removing the sub layer 500. For example, a process of removing the first sub layer 500 may be performed through a lift-off process. Accordingly, while the first sub layer 500 is removed, the absorption pattern 700 disposed on the first sub layer 500 may also be removed.

According to one embodiment, 10 to 20 of the unit layers 200 may be disposed under the etch stop layer 300. In this case, the mask for extreme ultraviolet lithography may satisfy an image contrast of 65% or more, a maximum defect size of 20 nm or more, and a threshold intensity of 0.15 or more. In other words, if the number of the plurality of unit layers 200 disposed under the etch stop layer 300 is controlled to be in the range of 10 to 20, the mask for extreme ultraviolet lithography may exhibit a high imaging performance.

In addition, a difference between the total number of the unit layers 200 included in the pre-reflective structure (PRS) and the number of the unit layers 200 disposed under the etch stop layer 300 may be controlled to improve an imaging performance of the mask for extreme ultraviolet lithography. Specifically, with a growing difference between the total number of the unit layers 200 included in the pre-reflective structure (PRS) and the number of the unit layers 200 disposed under the etch stop layer 300, an imaging performance of the mask for extreme ultraviolet lithography may be improved.

A conventional mask for extreme ultraviolet lithography has a structure in which a substrate 10, a unit layer 20, a first material layer 21, a second material layer 22, and a capping layer 40 are sequentially laminated, and has an absorption pattern 70 disposed on one side of a capping layer 40 as shown in FIG. 15. If the conventional mask has a defect, the defect (D) may be formed on the capping layer 40, so that the absorption pattern 70 and the defect (D) may be disposed on the same plane. In this case, during an imaging process using the mask, the defect D may be also transferred together, which may cause a problem in that an imaging performance is deteriorated.

However, the mask for extreme ultraviolet lithography according to an embodiment of the present invention may include: the reflective structure (RS) including the plurality of unit layers 200 laminated on the substrate 100 and the etch stop layer 300 placed between any one pair of adjoining unit layers among the plurality of unit layers 200, and having the trench T through which the etch stop layer 300 is exposed; the absorption pattern 700 placed on a bottom surface of the trench T; and the capping layer 400 placed on the unit layer 200 disposed on an uppermost portion, in which the unit layer 200 may include the first material layer 210 and a second material layer 220 on the first material layer 210.

If the mask according to the embodiment is defective, the defect may be formed on the capping layer 400, and thus the absorption pattern 700 and the defect may be disposed on different planes. Accordingly, if an aerial image is obtained by using the mask according to the embodiment, the defect may be focused out to increase a difference between the light intensity of an area where the defect is formed (defect area) and a threshold intensity of an area where the defect is not formed, thereby providing an insensitive property to fine defect. As a result, an imaging performance may be improved to increase the yield and throughput of an exposure process.

As above, the mask for extreme ultraviolet lithography according to an embodiment of the present invention, and the method for manufacturing the same have been described above. Hereinafter, specific experimental embodiments and the results of evaluating properties will be described with regard to the mask for extreme ultraviolet lithography according to an embodiment of the present invention, and the method for manufacturing the same.

Manufacturing of Mask for Extreme Ultraviolet Lithography According to Example 1

A unit layer (cell) in which a molybdenum (Mo) material layer and a silicon (Si) material layer are laminated on a substrate was formed. After a process of forming the unit layer was repeated 10 times to form 10 unit layers, an $SiO_2$ etch stop layer was formed on the unit layer disposed at the top, and a unit layer, in which a molybdenum (Mo) material layer and a silicon (Si) material layer are laminated on the etch stop layer, was formed, but the process of forming the unit layer was repeated 30 times to form 30 unit layers, thereby manufacturing a pre-reflective structure. In addition, a ruthenium (Ru) capping layer was formed on the unit layer disposed on an uppermost portion of the pre-reflective structure.

A trench through which an $SiO_2$ etch stop layer is exposed was formed by etching the pre-reflective structure and the capping layer manufactured by using an etch source having a selective etch ratio for the $SiO_2$ etch stop layer compared to the molybdenum (Mo) material layer and the silicon (Si) material layer. After that, the mask for extreme ultraviolet lithography according to Example 1 was manufactured by disposing a Ni absorption pattern at the trench.

Manufacturing of Mask for Extreme Ultraviolet Lithography According to Example 2

A mask for extreme ultraviolet lithography according to above Example 1 was manufactured, but the number of unit layers disposed under the $SiO_2$ etch stop layer was controlled to be 10, and the number of unit layers disposed thereover was controlled to be 50, thereby manufacturing a mask for extreme ultraviolet lithography according to above Example 2.

Manufacturing of Mask for Extreme Ultraviolet Lithography According to Example 3

A mask for extreme ultraviolet lithography according to above Example 1 was manufactured, but the number of unit layers disposed under the $SiO_2$ etch stop layer was controlled to be 15, and the number of unit layers disposed thereover was controlled to be 25. In addition, the reflectivity of a Ni absorption pattern was controlled to be 12%, thereby manufacturing a mask for extreme ultraviolet lithography according to above Example 3.

Manufacturing of Mask for Extreme Ultraviolet Lithography According to Example 4

A mask for extreme ultraviolet lithography according to above Example 1 was manufactured, but the number of unit layers disposed under the $SiO_2$ etch stop layer was controlled to be 15, and the number of unit layers disposed thereover was controlled to be 25. In addition, the reflectivity of a Ni absorption pattern was controlled to be 6%, thereby manufacturing a mask for extreme ultraviolet lithography according to above Example 4.

Manufacturing of Mask for Extreme Ultraviolet Lithography According to Example 5

A mask for extreme ultraviolet lithography according to above Example 1 was manufactured, but the number of unit layers disposed under the $SiO_2$ etch stop layer was controlled to be 20, and the number of unit layers disposed thereover was controlled to be 20, thereby manufacturing a mask for extreme ultraviolet lithography according to above Example 5.

Manufacturing of Mask for Extreme Ultraviolet Lithography According to Example 6

A mask for extreme ultraviolet lithography according to above Example 1 was manufactured, but a Pt absorption pattern was disposed at a trench, thereby manufacturing a mask for extreme ultraviolet lithography according to above Example 6.

Manufacturing of Mask for Extreme Ultraviolet Lithography According to Example 7

A mask for extreme ultraviolet lithography according to above Example 6 was manufactured, but the number of unit layers disposed under the $SiO_2$ etch stop layer was controlled to be 15, and the number of unit layers disposed thereover was controlled to be 25. In addition, the reflectivity of a Pt absorption pattern was controlled to be 15%, thereby manufacturing a mask for extreme ultraviolet lithography according to above Example 7.

Manufacturing of Mask for Extreme Ultraviolet Lithography According to Example 8

A mask for extreme ultraviolet lithography according to above Example 6 was manufactured, but the number of unit layers disposed under the $SiO_2$ etch stop layer was controlled to be 15, and the number of unit layers disposed thereover was controlled to be 25. In addition, the reflectivity of a Pt absorption pattern was controlled to be 12%, thereby manufacturing a mask for extreme ultraviolet lithography according to above Example 8.

Manufacturing of Mask for Extreme Ultraviolet Lithography According to Example 9

A mask for extreme ultraviolet lithography according to above Example 6 was manufactured, but the number of unit layers disposed under the $SiO_2$ etch stop layer was controlled to be 20, and the number of unit layers disposed thereover was controlled to be 20, thereby manufacturing a mask for extreme ultraviolet lithography according to above Example 9.

Manufacturing of Mask for Extreme Ultraviolet Lithography According to Comparative Example 1

A molybdenum (Mo) material layer and a silicon (Si) material layer were alternately and repeatedly laminated on a substrate, and a capping layer was formed on a silicon (Si) material layer disposed at the top, after which an Ni absorption pattern was disposed at one side of the capping layer, thereby manufacturing a mask for extreme ultraviolet lithography having a transmissive structure according to above Comparative Example 1.

Manufacturing of Mask for Extreme Ultraviolet Lithography According to Comparative Example 2

A mask for extreme ultraviolet lithography according to above Example 1 was manufactured, but excluding a $SiO_2$ etch stop layer, thereby manufacturing a mask for extreme ultraviolet lithography with all the unit layers etched according to above Comparative Example 2.

Manufacturing of Mask for Extreme Ultraviolet Lithography According to Comparative Example 3

A mask for extreme ultraviolet lithography according to above Example 1 was manufactured, but using NiFe as an etch stop layer, thereby manufacturing a mask for extreme ultraviolet lithography according to Comparative Example 3.

Manufacturing of Mask for Extreme Ultraviolet Lithography According to Comparative Example 4

A mask for extreme ultraviolet lithography according to above Example 3 was manufactured, but using NiFe as an etch stop layer, thereby manufacturing a mask for extreme ultraviolet lithography according to Comparative Example 4.

Manufacturing of Mask for Extreme Ultraviolet Lithography According to Comparative Example 5

A mask for extreme ultraviolet lithography according to above Example 5 was manufactured, but using NiFe as an etch stop layer, thereby manufacturing a mask for extreme ultraviolet lithography according to Comparative Example 5.

The structures of the masks for extreme ultraviolet lithography according to the above-described embodiments and comparative examples are summarized in Table 1 below.

TABLE 1

| Classification | Unit layer under etch stop layer | Unit layer over etch stop layer | Type of etch stop layer | Type of absorption pattern | Transfer mode |
|---|---|---|---|---|---|
| Example 1 | 10 | 30 | $SiO_2$ | Ni | Reflection |
| Example 2 | 10 | 50 | $SiO_2$ | Ni | Reflection |
| Example 3 | 15 | 25 | $SiO_2$ | Ni (12%) | Reflection |
| Example 4 | 15 | 25 | $SiO_2$ | Ni (6%) | Reflection |
| Example 5 | 20 | 20 | $SiO_2$ | Ni | Reflection |
| Example 6 | 10 | 30 | $SiO_2$ | Pt | Reflection |
| Example 7 | 15 | 25 | $SiO_2$ | Pt (15%) | Reflection |
| Example 8 | 15 | 25 | $SiO_2$ | Pt (12%) | Reflection |
| Example 9 | 20 | 20 | $SiO_2$ | Pt | Reflection |
| Comparative Example 1 | — | — | — | Ni | Transmission |
| Comparative Example 2 | — | — | — | Ni | Reflection |
| Comparative Example 3 | 10 | 30 | NiFe | Ni | Reflection |
| Comparative Example 4 | 15 | 25 | NiFe | Ni | Reflection |
| Comparative Example 5 | 20 | 20 | NiFe | Ni | Reflection |

FIG. 16 is a schematic view and an aerial image of a mask for extreme ultraviolet lithography according to Comparative Example 1 of the present invention.

FIG. 16(*a*) is a schematic view showing a mask for extreme ultraviolet lithography according to above Comparative Example 1, and FIG. 16(*b*) is an aerial image of a mask for extreme ultraviolet lithography according to above Comparative Example 1. As can be understood from FIGS. 16(*a*) and 16(*b*), it could be confirmed for the mask for extreme ultraviolet lithography according to Comparative Example 1 that an absorption pattern is disposed on a unit layer without a trench.

FIG. 17 is a schematic view and an aerial image of a mask for extreme ultraviolet lithography according to Example 1 of the present invention.

FIG. 17(*a*) is a schematic view showing a mask for extreme ultraviolet lithography according to above Example 1, and FIG. 17(*b*) is an aerial image of a mask for extreme ultraviolet lithography according to above Example 1. As can be understood from FIGS. 17(*a*) and 17(*b*), it could be confirmed for the mask for extreme ultraviolet lithography according to Example 1 that a trench is formed and an absorption pattern is disposed on a lower surface of the trench.

In addition, the image contrast (%) and normalized image log-slope (NILS) values of the masks for extreme ultraviolet lithography according to above Example 1 and Comparative Example 1 are summarized in Table 2 below.

TABLE 2

| Classification | Image contrast (%) | NILS |
|---|---|---|
| Comparative Example 1 | 79.6 | 2.55 |
| Example 1 | 80.3 | 2.51 |

As can be understood from FIGS. 16 and 17 and Table 2, it could be understood for the masks for extreme ultraviolet lithography according to above Example 1 and Comparative Example 1 that there is a very little difference between image contrast and NILS values. In other words, it could be confirmed that the mask for extreme ultraviolet lithography according to above Example 1 has a similar imaging performance compared to the conventional mask.

FIG. 18 is a schematic view and an aerial image of a mask for extreme ultraviolet lithography according to Comparative Example 1 of the present invention, when the mask has a defect.

FIG. 18(*a*) is a schematic view of a mask for extreme ultraviolet lithography according to above Comparative Example 1 when a capping layer included therein has a 20 nm-sized defect, and FIG. 18(*b*) is an aerial image of FIG. 18(*a*). As can be understood from FIGS. 18(*a*) and 18(*b*), it could be confirmed that an intensity distribution of a reflection area is distorted when there is a defect.

FIGS. 19 and 20 are a schematic view and an aerial image of a mask for extreme ultraviolet lithography according to Example 1 of the present invention, when the mask has a defect.

FIG. 19(*a*) is a schematic view of a mask for extreme ultraviolet lithography according to above Example 1 when a capping layer included therein has a 20 nm-sized defect, and FIG. 19(*b*) is an aerial image of FIG. 19(*a*). FIG. 20 is an aerial image of a mask for extreme ultraviolet lithography according to above Example 1 when a capping layer included therein has a 24 nm-sized defect.

As can be understood from FIGS. 19 and 20, it could be confirmed for the mask for extreme ultraviolet lithography according to above Example 1 that an intensity distribution of a reflection area is distorted when the capping layer has a defect, but a degree of distortion is remarkably small compared to Comparative Example 1. In particular, it could be confirmed that an intensity distribution is similar in a reflection area of the masks for extreme ultraviolet lithography according to Comparative Example 1 with a 20 nm-sized defect and Example 1 with a 24 nm-sized defect. In other words, it can be understood that the mask for extreme ultraviolet lithography according to the embodiment has a larger degree of permissible defects compared to the conventional mask.

FIG. 21 is a graph showing a difference between intensity and threshold intensity in a defect area of a mask for extreme ultraviolet lithography.

FIG. 21 shows a difference between intensity and threshold intensity in a defect area. The threshold intensity may be based on an intensity related to the transfer ability of the mask.

FIG. 22 is a graph comparing the properties of masks for extreme ultraviolet lithography according to Example 6, Example 7, and Comparative Example 1 of the present invention.

FIG. 22 shows a difference between intensity and threshold intensity in a defect area of the masks for extreme ultraviolet lithography according to above Example 6, Example 7, and Comparative Example 1. As can be understood from FIG. 22, the mask for extreme ultraviolet lithography according to above Example 6 showed a difference of 67% between intensity and threshold intensity, the mask for extreme ultraviolet lithography according to above Example 7 showed a difference of 64% between intensity and threshold intensity, and the mask for extreme ultraviolet lithography according to above Comparative Example 1 showed a difference of 51% between intensity and threshold intensity.

Accordingly, it could be understood that a degree of distortion of the aerial image decreases with a growing difference between the number of unit layers disposed under the etch stop layer and the total number of unit layers disposed on a substrate.

In addition, it can be understood that a defect of 24 nm is allowed for the mask for extreme ultraviolet lithography according to Example 7 and a defect of 26 nm is allowed for the mask for extreme ultraviolet lithography according to Example 8 in order to represent a difference of 51% between intensity and threshold intensity.

FIG. 23 is a graph comparing the properties of masks for extreme ultraviolet lithography according to Example 1, Example 2, Comparative Example 1, and Comparative Example 2 of the present invention.

FIG. 23 shows a difference between intensity and threshold intensity in a defect area of the masks for extreme ultraviolet lithography according to above Example 1, Example 2, Comparative Example 1 and Comparative Example 2. As can be confirmed from FIG. 23, the mask for extreme ultraviolet lithography according to above Example 1 showed a difference of 66% between intensity and threshold intensity, the mask for extreme ultraviolet lithography according to above Example 2 showed a difference of 70% between intensity and threshold intensity, and the mask for extreme ultraviolet lithography according to above Comparative Example 2 showed a difference of 64% between intensity and threshold intensity.

Accordingly, it could be confirmed again that a degree of distortion of the aerial image decreases with a growing difference between the number of unit layers disposed under the etch stop layer and the total number of unit layers disposed on a substrate.

In addition, it can be understood that a defect of 26 nm is allowed for the mask for extreme ultraviolet lithography according to Example 1, a defect of 24 nm is allowed for the mask for extreme ultraviolet lithography according to Comparative Example 2, and a defect of 28 nm is allowed for the mask for extreme ultraviolet lithography according to Example 2 in order to represent a difference of 51% between intensity and threshold intensity.

FIG. 24 is a graph comparing the properties of masks for extreme ultraviolet lithography according to Example 7 and Example 8 of the present invention.

FIG. 24 shows a difference between intensity and threshold intensity in a defect area of the masks for extreme ultraviolet lithography according to above Example 7 and Example 8. As can be confirmed from FIG. 24, the mask for extreme ultraviolet lithography according to above Example 7 showed a difference of 66% between intensity and threshold intensity, and the mask for extreme ultraviolet lithography according to above Example 8 showed a difference of 64% between intensity and threshold intensity.

FIG. 25 is a graph comparing the properties of masks for extreme ultraviolet lithography according to Example 3 and Example 4 of the present invention.

FIG. 25 shows a difference between intensity and threshold intensity in a defect area of the masks for extreme ultraviolet lithography according to above Example 3 and Example 4. As can be confirmed from FIG. 25, the mask for extreme ultraviolet lithography according to above Example 3 showed a difference of 64% between intensity and threshold intensity, and the mask for extreme ultraviolet lithography according to above Example 4 showed a difference of 61% between intensity and threshold intensity.

In addition, it can be understood that a defect of 26 nm is allowed for the mask for extreme ultraviolet lithography according to Example 7 and a defect of 24 nm is allowed for the mask for extreme ultraviolet lithography according to Example 3 in order to represent a difference of 51% between intensity and threshold intensity.

FIG. 26 is a graph showing the properties of an etch stop layer included in a mask for extreme ultraviolet lithography according to an embodiment of the present invention.

FIG. 26 shows a reflectivity of EUV depending on a thickness measured by changing a thickness of the masks for extreme ultraviolet lithography according to above Example 1, Example 3, Example 5, Comparative Example 3, Comparative Example 4 and Comparative Example 5.

As can be confirmed from FIG. 25, it can be confirmed that the masks for extreme ultraviolet lithography according to above embodiments have a higher reflectivity than that of the masks for extreme ultraviolet lithography according to Comparative Examples. In addition, it can be confirmed that the masks for extreme ultraviolet lithography according to above embodiments have a highest reflectivity in a thickness of 5.45 nm to 6.6 nm.

Accordingly, in the case of manufacturing the mask for extreme ultraviolet lithography according to above embodiment, it could be understood that a method for increasing reflectivity is to use $SiO_2$ as a material of the etch stop layer and control a thickness to be 5.45 nm to 6.6 nm.

FIGS. 27 to 29 are graphs for confirming the optimal number of etch stop layers disposed under the etch stop layer included in a mask for extreme ultraviolet lithography according to an embodiment of the present invention.

Referring to FIG. 27, a mask for extreme ultraviolet lithography according to the above embodiments was prepared, but the number of etch stop layers disposed under the etch stop layer was controlled to be 5, 10, 15, 20 and 25, and Ni and Pt were used as an absorption pattern, so that a maximum defect size (nm) was measured and shown for each case.

As can be confirmed from FIG. 27, it could be confirmed that the number of etch stop layers disposed under the etch stop layer needs to be controlled to be 5 to 20 so that the maximum defect size can be 20 nm or more.

Referring to FIG. 28, a mask for extreme ultraviolet lithography according to the above embodiments was prepared, but the number of etch stop layers disposed under the etch stop layer was controlled to be 5, 10, 15, 20 and 25, and Ni and Pt were used as an absorption pattern, so that an image contrast (%) was measured and shown for each case.

As can be confirmed from FIG. 28, it could be confirmed that the number of etch stop layers disposed under the etch stop layer needs to be controlled to be 5 to 20 in order to obtain the image contrast of 65% or more.

Referring to FIG. 29, a mask for extreme ultraviolet lithography according to the above embodiments was prepared, but the number of etch stop layers disposed under the etch stop layer was controlled to be 5, 10, 15, 20 and 25, and Ni and Pt were used as an absorption pattern, so that a threshold intensity was measured and shown for each case.

As can be confirmed from FIG. 29, it could be confirmed that the number of etch stop layers disposed under the etch stop layer needs to be controlled to be 10 to 25 in order to obtain the threshold intensity of 0.15 or more.

As a result, it could be understood that the number of etch stop layers disposed under the etch stop layer needs to be controlled to be 10 to 20 in order to manufacture a mask for extreme ultraviolet lithography with an improved image performance.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

INDUSTRIAL APPLICABILITY

A mask for extreme ultraviolet lithography and a method for manufacturing the same according to an embodiment of the present invention can be utilized in various thin film patterning processes such as logic ICs, memory semiconductors, CIS, display devices, etc.

The invention claimed is:

1. A method for manufacturing a mask for extreme ultraviolet lithography, the method comprising:

preparing a pre-reflective structure including a plurality of unit layers laminated on a substrate and an etch stop layer placed between one pair of adjoining unit layers among plurality of unit layers;

etching the pre-reflective structure to manufacture a reflective structure having a trench through which the etch stop layer is exposed; and forming an absorption pattern on a bottom surface of the trench, wherein the etch stop layer includes $SiO_2$, a thickness of the etch stop layer is 5.45 nm to 6.6 nm, and the number of the plurality of unit layers disposed under the etch stop layer is controlled to be in the range of 10 to 20, wherein the preparing of the pre-reflective structure comprises:

a first lamination step including forming a first material layer on the substrate and forming a second material layer on the first material layer;

forming the etch stop layer on the second material layer; and a second lamination step including forming the first material layer on the etch stop layer and forming the second material layer on the first material layer, wherein the first lamination step and the second lamination step are repeated a plurality of times, wherein the first material layer includes molybdenum and the second material layer includes silicon, and a thickness of the first material layer is 3.5 nm to 4.9 nm and a thickness of the second material layer is 2.1 nm to 3.5 nm, wherein the forming of the etch stop layer comprises a step of thermally oxidizing the uppermost second material layer in the first lamination step, which is performed first among the plurality of the first lamination step, wherein the thickness of the uppermost second material layer before the thermal oxidation is performed in the first lamination step is larger than the thickness of the second material layer that is not thermally oxidized, and wherein the thickness of the uppermost second material layer after the thermal oxidation is performed is the same as the thickness of the second material layer that is not thermally oxidized.

2. The method of claim 1, wherein a number of repeating the first lamination step is less than or equal to a number of repeating the second lamination step.

3. The method of claim 1, wherein in the manufacturing of the reflective structure, the etch stop layer comprises an etch selection ratio compared to the first material layer and the second material layer for an etch source provided to the pre-reflective structure.

4. The method of claim 1, wherein oxygen (O) penetrates into the second material layer of the uppermost portion to form an oxygen concentration gradient inside the second material layer of the uppermost portion while the second material layer of the uppermost portion is thermally oxidized.

* * * * *